US012638476B2

(12) United States Patent
Shen et al.

(10) Patent No.: US 12,638,476 B2
(45) Date of Patent: May 26, 2026

(54) VOLTAGE SAMPLING APPARATUS AND RELATED METHOD

(71) Applicant: Huawei Digital Power Technologies Co., Ltd., Shenzhen (CN)

(72) Inventors: Dinghua Shen, Shenzhen (CN);
Wenguang Li, Dongguan (CN);
Baoguo Chen, Dongguan (CN);
Hongda Weng, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 165 days.

(21) Appl. No.: 18/419,284

(22) Filed: Jan. 22, 2024

(65) Prior Publication Data

US 2024/0159798 A1 May 16, 2024

Related U.S. Application Data

(63) Continuation of application No. PCT/CN2021/107869, filed on Jul. 22, 2021.

(51) Int. Cl.
*G01R 15/04* (2006.01)
*G01R 19/00* (2006.01)
*G01R 35/00* (2006.01)
(52) U.S. Cl.
CPC ......... *G01R 15/04* (2013.01); *G01R 19/0084* (2013.01); *G01R 35/005* (2013.01)

(58) Field of Classification Search
CPC ... G01R 15/04; G01R 19/0084; G01R 35/005
See application file for complete search history.

(56) References Cited

U.S. PATENT DOCUMENTS

| | | | |
|---|---|---|---|
| 2006/0197569 A1* | 9/2006 | Capodivacca | ...... H02M 3/1584 |
| | | | 327/175 |
| 2020/0408867 A1* | 12/2020 | Ishikawa | ............... H02P 29/024 |
| 2024/0219434 A1* | 7/2024 | Kagaya | ............ G01R 19/16528 |

FOREIGN PATENT DOCUMENTS

| | | |
|---|---|---|
| CN | 101915897 A | 12/2010 |
| CN | 108663622 B | 6/2020 |
| JP | 2009268068 A | 11/2009 |

* cited by examiner

*Primary Examiner* — Akm Zakaria

(57) ABSTRACT

The voltage sampling apparatus includes a differential circuit, a voltage division circuit, and a first calibration switch. A first output end of the differential circuit and an input end of a first voltage division branch of the voltage division circuit are connected to one end of the first calibration switch. A second output end of the differential circuit and an input end of a second voltage division branch of the voltage division circuit are connected to the other end of the first calibration switch. When the first calibration switch is in an on state, the differential circuit is configured to input a target signal to the first voltage division branch and the second voltage division branch that are connected in parallel.

20 Claims, 25 Drawing Sheets

Battery product

N series-connected cells 202

Voltage sampling apparatus 201

P+

P−

Back-to-back
POMS transistor

Figure 6:
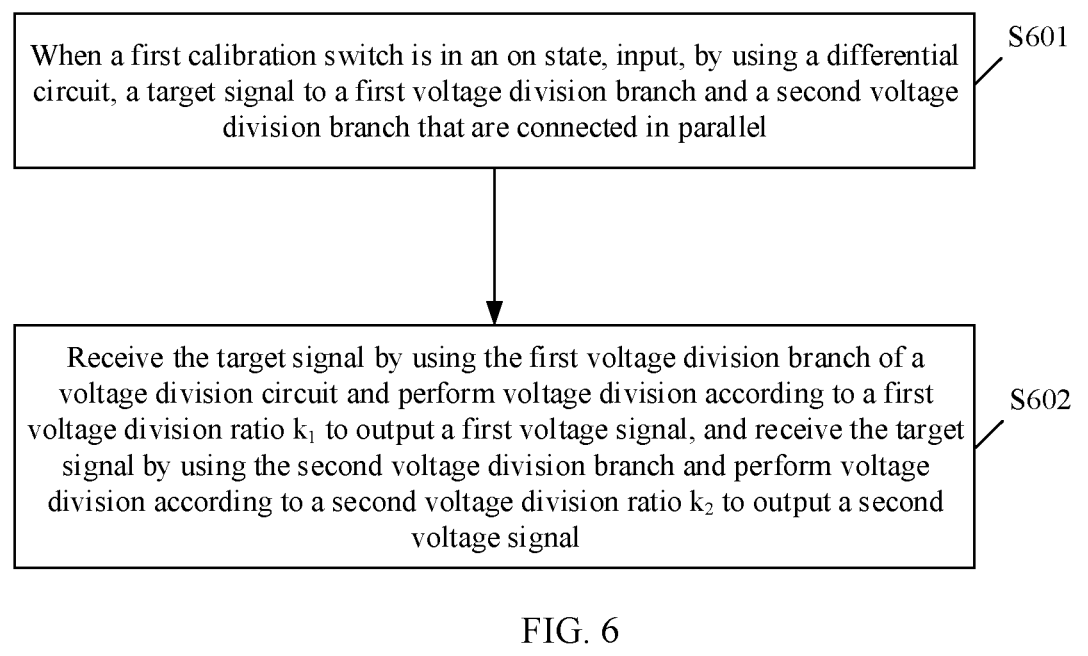

When a first calibration switch is in an on state, input, by using a differential circuit, a target signal to a first voltage division branch and a second voltage division branch that are connected in parallel

S601

Receive the target signal by using the first voltage division branch of a voltage division circuit and perform voltage division according to a first voltage division ratio $k_1$ to output a first voltage signal, and receive the target signal by using the second voltage division branch and perform voltage division according to a second voltage division ratio $k_2$ to output a second voltage signal

VOLTAGE SAMPLING APPARATUS AND RELATED METHOD

CROSS-REFERENCE TO RELATED APPLICATIONS

This application is a continuation of International Application No. PCT/CN2021/107869, filed on Jul. 22, 2021, the disclosure of which is hereby incorporated by reference in its entirety.

TECHNICAL FIELD

This application relates to the field of power electronics technologies, and in particular, to a voltage sampling apparatus and a related method.

BACKGROUND

With the progress and development of digital technologies, the electronic industry gradually enters the digital era. Analog-to-digital conversion circuitry, as an interface between analog and digital circuitry, is operable to a sample an analog voltage signal into a digital signal through sampling. To meet high performance requirements in various application scenarios, high requirements are in demand.

Currently, common multi-channel voltage signal sampling technologies include two types: One is an isolation sampling technology in which a voltage signal sampled by each channel is input to a sampling chip. In addition, in this technology, due to a withstand voltage limitation of the sampling chip, a signal processing circuit, a signal isolation circuit, an isolation circuit, and the like need to be added to process the voltage signal before the voltage signal is sent to the sampling chip. The other type of sampling technique includes a resistor voltage division differential sampling technology in which, after a voltage division of each high-end voltage is reduced, a differential voltage is sent to a sampling chip. In addition, in this technology, because voltage limitations of the sampling chip needs to be met, a differential resistor element is used accordingly for the sampling chip to the withstand voltage limitation conditions.

However, in an actual application process, it is found that, for the foregoing isolation sampling technology, because multiple circuit modules need to be added to process a voltage signal, a problem of increasing costs of the isolation sampling technology is caused, and batch production is not facilitated. For the foregoing resistor voltage division differential sampling technology, due to a manufacturing process of a resistor element or other environmental factors, a problem of an electrical characteristic deviation of the resistor element is caused, and voltage signal sampling precision is reduced.

Therefore, there is a need for a simplified voltage sampling circuit with higher sampling precision.

SUMMARY

Embodiments of the present disclosure provide a voltage sampling apparatus and a related method, to provide a more simplified voltage sampling apparatus with higher sampling precision.

According to a first aspect, an embodiment of the present disclosure provides a voltage sampling apparatus. The voltage sampling apparatus includes a differential circuit, a voltage division circuit, and a first calibration switch. The voltage division circuit includes a first voltage division branch and a second voltage division branch. A first output end of the differential circuit and an input end of the first voltage division branch are connected to a first end of the first calibration switch. A second output end of the differential circuit and an input end of the second voltage division branch are connected to a second end of the first calibration switch. When the first calibration switch is in an on state, the differential circuit is configured to: input a target signal to the first voltage division branch and the second voltage division branch that are connected in parallel, where the target signal is a first differential output signal output by the first output end or a second differential output signal output by the second output end. The voltage division circuit is configured to: receive the target signal by using the first voltage division branch and perform voltage division according to a first voltage division ratio $k_1$ to output a first voltage signal, and receive the target signal by using the second voltage division branch and perform voltage division according to a second voltage division ratio $k_2$ to output a second voltage signal, where a difference between the first voltage signal and the second voltage signal is a first deviation signal, and the first deviation signal is used to calibrate a difference between the first voltage division ratio and the second voltage division ratio.

When sampling is performed on the difference of the voltage signals output by the differential circuit, that is, a voltage signal at one end of the differential circuit and a voltage signal at the other end are separately sampled to obtain the difference between the voltage signals at the two ends of the differential circuit, a differential sampling signal of the differential circuit is obtained (it should be emphasized that, to facilitate restoration, based on the sampled voltage signals, of the difference between the voltage signals actually output by the differential circuit, voltage division usually needs to be performed on the two voltage division branches according to the same ratio). However, in a process of sampling the voltage signals at the two ends of the differential circuit, because a sampling chip cannot bear a large voltage signal output by the differential circuit, the voltage signal provided by the differential circuit usually needs to be reduced in a voltage division manner according to a specific ratio. In other words, the voltage signal output by one end of the differential circuit is divided by using the first voltage division branch according to a voltage division ratio, and the voltage signal output by the other end of the differential circuit is divided by using the second voltage division branch according to a same voltage division ratio. In this way, the sampling chip can bear a voltage signal that is reduced by ratio by a voltage division branch. However, in a process in which the voltage division branch provides a voltage signal reduction function, because there is a specific error between an actual resistance value and a theoretical resistance value of a voltage division resistor on each voltage division branch, capabilities (namely, voltage division capabilities) of voltage signal reduction of the two voltage division branches are different, and an error exists between a voltage signal actually sampled by the sampling chip and a voltage signal theoretically sampled. As a result, the difference between the voltage signals actually provided by the differential circuit cannot be accurately restored according to a theoretical voltage division ratio based on the voltage signal sampled by the sampling chip. In other words, a sampling result is inaccurate, and sampling precision is low.

In this embodiment of the present disclosure, the first calibration switch is added based on a conventional technology, and the first calibration switch controls a connection status of the first voltage division branch and the second voltage division branch. When the first calibration switch is in an on state, the voltage sampling apparatus is in a calibration state, to calibrate the difference between the voltage division ratio of the first voltage division branch and the voltage division ratio of the second voltage division branch. This improves sampling precision of the voltage sampling apparatus. Specifically, it is assumed that the first voltage division branch in the voltage sampling apparatus includes a plurality of series-connected resistors (for example, R1 and R2), the second voltage division branch includes a plurality of series-connected resistors (for example, R3 and R4), R1=R3, and R2=R4. According to a voltage division principle of the voltage division circuit, in this case, the first voltage division ratio of the first voltage division branch is $k_1$=R1/R1+R2, and the second voltage division ratio of the second voltage division branch is $k_2$=R3/R1+R2. Theoretically, the voltage division ratio of the first voltage division branch is the same as that of the second voltage division branch. In other words, theoretically the difference between $k_1$ and $k_2$ is 0. However, because there is a specific error between a theoretical resistance value and an actual resistance value of the resistor in each voltage division branch, there is an error between a theoretical value and an actual value of $k_1$, and there is an error between a theoretical value and an actual value of $k_2$. As a result, there is an error in the difference between $k_1$ and $k_2$, that is, actually $k_1$−$k_2$=$\Delta k$, and $\Delta k$ is not 0. In conclusion, due to the error, a voltage division capability of the first voltage division branch is different from a voltage division capability of the second voltage division branch. When the difference between the voltage signals actually provided by the differential circuit is restored according to the theoretical voltage division ratio based on the voltage signal sampled by the sampling chip, a restoration result is affected by an error obtained after errors of the two voltage division ratios are superimposed. This reduces sampling precision of the voltage sampling apparatus. Therefore, to avoid impact on sampling precision caused by different voltage division capabilities of the two voltage division branches, in this embodiment of the present disclosure, the first calibration switch is switched on, so that the first voltage division branch and the second voltage division branch are in a parallel-connected state, and the first voltage division branch and the second voltage division branch separately receive a target signal $U_{target}$ (the first differential output signal or the second differential output signal) output by the differential circuit, so that the difference (the first deviation signal) of the voltage signals output by the voltage division circuit can be actually measured, where the first deviation signal may indicate a deviation between the voltage division capabilities of the two voltage division branches. Therefore, the deviation is superimposed on one of the voltage division branches, so that the voltage division capabilities of the two voltage division branches are equal. Further, sampling precision originally determined by superimposing two error factors (a first voltage division ratio error and a second voltage division ratio error) is converted into sampling precision determined by one error factor (the first voltage division ratio error or the second voltage division ratio error). That is, the error factor is reduced. Subsequently, only one error factor is used for calibration, so that sampling precision can be improved. In conclusion, based on the first deviation signal, an error of the difference between the voltage division ratios provided by the two voltage division branches can be calibrated, so that the voltage division capability of the first voltage division branch is the same as the voltage division capability of the second voltage division branch. This effectively eliminates a sampling error caused by inconsistent voltage division capabilities of the two voltage division branches, and improves sampling precision.

In a possible implementation, when the first calibration switch is in an off state, the first voltage division branch and the second voltage division branch are switched from a parallel-connected state to an open-circuit state. The differential circuit is further configured to: input the first differential output signal to the first voltage division branch through the first output end, and input the second differential output signal to the second voltage division branch through the second output end. The voltage division circuit is further configured to: receive the first differential output signal by using the first voltage division branch and perform voltage division according to $k_1$ to output a third voltage signal, and receive the second differential output signal by using the second voltage division branch and perform voltage division according to $k_2$ to output a fourth voltage signal, where a difference between the third voltage signal and the fourth voltage signal is a first sampling signal.

In this embodiment of the present disclosure, when the first calibration switch is switched from the on state to the off state, the voltage sampling apparatus enters a sampling state, the first voltage division branch and the second voltage division branch in the voltage division circuit are switched from the parallel-connected state to the open-circuit state, and the first voltage division branch and the second voltage division branch respectively receive the different voltage signals and perform voltage division according to the respective voltage division ratios, to output a voltage signal that can be borne by the sampling chip. Specifically, the first voltage division branch receives the voltage signal output by one end of the differential circuit, and the second voltage division branch receives the voltage signal output by the other end of the differential circuit. Then, the two voltage division branches respectively perform voltage division on the two voltage signals according to the respective voltage division ratios, and determine a difference between the two voltage signals obtained through voltage division as a first differential sampling signal.

In a possible implementation, the voltage sampling apparatus further includes a calibration module. The calibration module is configured to: obtain a second sampling signal through calculation based on the first deviation signal and the first sampling signal, where the second sampling signal indicates a difference between voltage signals obtained after voltage division is performed on the first differential output signal and the second differential output signal according to a same voltage division ratio, and the same voltage division ratio is the first voltage division ratio or the second voltage division ratio; and when the target signal is the first differential output signal, restore, according to $k_2$, the second sampling signal as a sampling value of a difference between the first differential output signal and the second differential output signal; or when the target signal is the second differential output signal, restore, according to $k_1$, the second sampling signal as a sampling value of a difference between the first differential output signal and the second differential output signal.

In this embodiment of the present disclosure, the calibration module may remove, based on the first sampling signal, the foregoing first deviation signal (namely, a sampling error caused by inconsistent voltage division capabilities of the two voltage division branches) to obtain the second sampling signal, so that the sampling error caused by the inconsistent voltage division capabilities of the two voltage division branches is effectively eliminated. In other words, the sampling precision originally determined by superimposing the two error factors (namely, the first voltage division ratio error and the second voltage division ratio error) is converted into the sampling precision determined by one error factor (namely, the first voltage division ratio error or the second voltage division ratio error). The error factor is reduced. Further, the second sampling signal is restored, according to the theoretical voltage division ratio, as a sampling value of the difference between the two voltage signals actually output by the differential circuit. This avoids the sampling error caused by the inconsistent voltage division capabilities of the two voltage division branches, and improves sampling precision.

In a possible implementation, the calibration module is specifically configured to: calculate the second sampling signal according to an equation $U_{sampling1}-U_{difference1}(k_1-k_2)-k_2$ $(U_{difference1}-U_{difference2})$ or an equation $U_{sampling1}-U_{difference2}(k_1-k_2)-k_1(U_{difference1}-U_{difference2})$, where $U_{sampling1}$ indicates the first sampling signal, $U_{difference1}$ indicates the first differential output signal, $U_{difference2}$ indicates the second differential output signal, $U_{difference1}(k_1-k_2)$ and $U_{difference2}(k_1-k_2)$ indicate the first deviation signal, and $k_2(U_{difference1}-U_{difference2})$ and $k_1(U_{difference1}-U_{difference2})$ indicate the second differential sampling signal.

In this embodiment of the present disclosure, the calibration module may calculate the second sampling signal according to the equation $U_{sampling1}-U_{difference1}(k_1-k_2)-k_2$ $(U_{difference1}-U_{difference2})$ or the equation $U_{sampling1}-U_{difference2}(k_1-k_2)=k_1(U_{difference1}-U_{difference2})$, to remove, based on the first sampling signal, the foregoing first deviation signal (namely, the sampling error caused by the inconsistent voltage division capabilities of the two voltage division branches) to obtain the second sampling signal, so that the sampling error caused by the inconsistent voltage division capabilities of the two voltage division branches is effectively eliminated. In other words, the sampling precision originally determined by superimposing the two error factors (namely, the first voltage division ratio error and the second voltage division ratio error) is converted into the sampling precision determined by one error factor (namely, the first voltage division ratio error or the second voltage division ratio error). The error factor is reduced. Further, the second sampling signal is restored, according to the theoretical voltage division ratio, as the sampling value of the difference between the two voltage signals actually output by the differential circuit. This avoids the sampling error caused by the inconsistent voltage division capabilities of the two voltage division branches, and improves sampling precision.

In a possible implementation, the differential circuit includes a first switch group and a second switch group, where one end of an $i^{th}$ first switch in the first switch group is connected to a $(2i-1)^{th}$ cell in N series-connected cells, and the other end is connected to the first output end; one end of an $i^{th}$ second switch in the second switch group is connected to a $2i^{th}$ cell in the N series-connected cells, and the other end is connected to the second output end; and N is an integer greater than 1, and i=1, 2, . . . , or N.

In this embodiment of the present disclosure, because multiple paths of differential sampling may be performed on the N series-connected cells, the first switch group and the second switch group may be designed in the differential circuit. The first switch group may be configured to control a voltage signal flow direction of an odd-numbered cell, and the second switch group may be configured to control a voltage signal flow direction of an even-numbered cell.

In a possible implementation, the first calibration switch is in an on state; and when the $i^{th}$ first switch is in an on state and the $i^{th}$ second switch is in an off state, the differential circuit is specifically configured to: receive a first differential input signal output by the $(2i-1)^{th}$ cell, and input, by using the $i^{th}$ first switch that is switched on, the first differential output signal to the first voltage division branch and the second voltage division branch that are connected in parallel; or when the $i^{th}$ first switch is in an off state and the $i^{th}$ second switch is in an on state, the differential circuit is specifically configured to: receive a second differential input signal output by the $2i^{th}$ cell, and input, by using the $i^{th}$ second switch that is switched on, the second differential output signal to the first voltage division branch and the second voltage division branch that are connected in parallel.

In this embodiment of the present disclosure, when the first calibration switch is switched on, the voltage sampling apparatus is in a voltage signal calibration stage. The first voltage division branch and the second voltage division branch receive only one same voltage signal. Therefore, the $i^{th}$ first switch may be switched on, and the $i^{th}$ second switch may be switched off, to ensure that only a voltage signal of the $(2i-1)^{th}$ cell is input to the differential circuit, and the differential circuit outputs only the first differential output signal. Alternatively, the $i^{th}$ second switch may be switched on, and the $i^{th}$ first switch may be switched off, to ensure that only a voltage signal of the $2i^{th}$ cell is input to the differential circuit, and the differential circuit outputs only the second differential output signal. In conclusion, the deviation signal is obtained based on the first differential output signal or the deviation signal is obtained based on the second differential output signal. This can effectively eliminate the sampling error caused by the inconsistent voltage division capabilities of the two voltage division branches, and improves sampling precision based on the deviation signal.

In a possible implementation, the first calibration switch is in an off state; and when both the $i^{th}$ first switch and the $i^{th}$ second switch are in an on state, the differential circuit is specifically configured to: receive a first differential input signal output by the $(2i-1)^{th}$ cell and input the first differential output signal to the first voltage division branch by using the $i^{th}$ first switch that is switched on, and receive a second differential input signal output by the $2i^{th}$ cell and input the second differential output signal to the second voltage division branch by using the $i^{th}$ second switch that is switched on.

In this embodiment of the present disclosure, when the first calibration switch is switched off, the voltage sampling apparatus is in a voltage signal sampling stage. The first voltage division branch and the second voltage division branch need to receive two different voltage signals. Therefore, the $i^{th}$ first switch and the $i^{th}$ second switch may be switched on, to ensure that the differential circuit can separately receive voltage signals of the $(2i-1)^{th}$ cell and the $2i^{th}$ cell, and the differential circuit can separately output two voltage signals (obtained based on the voltage signals of the $(2i-1)^{th}$ cell and the $2i^{th}$ cell).

In a possible implementation, the voltage sampling apparatus further includes a second calibration switch; one end of the second calibration switch is connected to the first end of the first calibration switch, and the other end is connected to a reference power supply; and when both the $i^{th}$ first switch and the $i^{th}$ second switch are in an off state, and the first calibration switch and the second calibration switch are in an on state, the voltage division circuit is further configured to: receive, by using the second voltage division branch, a reference voltage signal output by the reference power supply, and perform voltage division according to $k_2$ to output a fifth voltage signal, where the fifth voltage signal is used to calibrate $k_2$.

In this embodiment of the present disclosure, through the foregoing step, the sampling precision originally determined by superimposing the two error factors (the first voltage division ratio error and the second voltage division ratio error) is converted into the sampling precision determined by one error factor (the first voltage division ratio error or the second voltage division ratio error). Further, to avoid impact of the only error factor on sampling, a difference that is closer to the difference between the two voltage signals actually output by the differential circuit is obtained. The second calibration switch is added to the voltage sampling apparatus, is externally connected to the reference power supply, and is configured to calibrate a voltage division ratio of each voltage division branch in the voltage division circuit. Specifically, when the first calibration switch and the second calibration switch are in an on state, the second voltage division branch in the voltage division circuit can receive the voltage signal output by the reference power supply, and then the second voltage division branch performs voltage division on the voltage signal and outputs the fifth voltage signal, so that a value of the fifth voltage signal can be actually measured. The reference power supply can output a stable and known voltage signal. Therefore, the voltage division ratio of the second voltage division branch may be obtained based on the actually measured value of the fifth voltage signal and a value of the voltage signal of the reference power supply, to calibrate the voltage division ratio of the second voltage division branch.

In a possible implementation, the calibration module is specifically configured to: when the target signal is the first differential output signal, restore, according to the calibrated $k_2$, the second sampling signal as the sampling value of the difference between the first differential output signal and the second differential output signal.

In this embodiment of the present disclosure, the second sampling signal is restored, according to the calibrated second voltage division ratio, as the sampling value of the difference between the two voltage signals actually output by the differential circuit. This avoids a sampling error caused to sampling by the voltage division ratio, and further improves sampling precision of the voltage sampling apparatus.

In a possible implementation, when the $i^{th}$ first switch, the $i^{th}$ second switch, and the first calibration switch are all in an off state, and the second calibration switch is in an on state, the voltage division circuit is further configured to: receive, by using the first voltage division branch, the reference voltage signal output by the reference power supply, and perform voltage division according to $k_1$ to output a sixth voltage signal, where the sixth voltage signal is used to calibrate $k_1$.

In this embodiment of the present disclosure, when the first calibration switch is in an off state, and the second calibration switch is in an on state, the first voltage division branch in the voltage division circuit can receive the voltage signal output by the reference power supply, and then the first voltage division branch performs voltage division on the voltage signal and outputs the sixth voltage signal, so that a value of the sixth voltage signal can be actually measured. The reference power supply can output a stable and known voltage signal. Therefore, the voltage division ratio of the first voltage division branch may be obtained based on the actually measured value of the sixth voltage signal and the value of the voltage signal of the reference power supply, to calibrate the voltage division ratio of the first voltage division branch.

In a possible implementation, the calibration module is specifically configured to: when the target signal is the second differential output signal, restore, according to the calibrated $k_1$, the second sampling signal as the sampling value of the difference between the first differential output signal and the second differential output signal.

In this embodiment of the present disclosure, the second sampling signal is restored, according to the calibrated first voltage division ratio, as the sampling value of the difference between the two voltage signals actually output by the differential circuit. This avoids the sampling error caused to sampling by the voltage division ratio, and further improves sampling precision of the voltage sampling apparatus.

In a possible implementation, a ground end of the first voltage division branch and a ground end of the second voltage division branch are both connected to a ground cable. The first voltage division branch includes M series-connected first voltage division resistors, the second voltage division branch includes M series-connected second voltage division resistors, and M is an integer greater than 1. When the first calibration switch is in an on state, the voltage division circuit is specifically configured to: perform, by using the M series-connected first voltage division resistors, voltage division on the target signal according to $k_1$ to output the first voltage signal, and perform, by using the M series-connected second voltage division resistors, voltage division on the target signal according to $k_2$ to output the second voltage signal.

In this embodiment of the present disclosure, the ground ends of the two voltage division branches in the voltage division circuit are connected to the ground cable, and a voltage division element may be a plurality of series-connected resistors, to implement voltage division on an input voltage signal, to output a voltage signal that meets a voltage withstand limitation condition of the sampling chip. Specifically, when the first calibration switch is in an on state, the first voltage division branch and the second voltage division branch separately perform voltage division on the target signal (the first differential output signal or the second differential output signal) by using respective voltage division resistors, to output two voltage signals obtained through voltage division.

In a possible implementation, when the first calibration switch is in an off state, the voltage division circuit is specifically configured to: perform, by using the M series-connected first voltage division resistors, voltage division on the first differential output signal according to $k_1$ to output the third voltage signal, and perform, by using the M series-connected second voltage division resistors, voltage division on the second differential output signal according to $k_2$ to output the fourth voltage signal.

In this embodiment of the present disclosure, when the first calibration switch is in an off state, the first voltage division branch receives the first differential output signal, and performs voltage division on the signal by using the voltage division resistors, to output the voltage signal obtained through voltage division. The second voltage division branch receives the second differential output signal, and performs voltage division on the signal by using the voltage division resistors, to output the voltage signal obtained through voltage division.

In a possible implementation, the voltage sampling apparatus further includes an analog-to-digital converter. The analog-to-digital converter is configured to: receive an output signal of the voltage division circuit, and convert the output signal from an analog signal into a digital signal, where the output signal includes the first voltage signal and the second voltage signal, or the third voltage signal and the fourth voltage signal, or the fifth voltage signal, or the sixth voltage signal.

In this embodiment of the present disclosure, the voltage sampling apparatus may further include the analog-to-digital converter. The analog-to-digital converter can directly convert an analog signal output by the voltage division circuit into a digital signal, to facilitate subsequent digital operation.

According to a second aspect, an embodiment of the present disclosure provides a voltage sampling method, applied to a voltage sampling apparatus. The voltage sampling apparatus includes a differential circuit, a voltage division circuit, and a first calibration switch. The voltage division circuit includes a first voltage division branch and a second voltage division branch. A first output end of the differential circuit and an input end of the first voltage division branch are connected to a first end of the first calibration switch. A second output end of the differential circuit and an input end of the second voltage division branch are connected to a second end of the first calibration switch. The method includes: when the first calibration switch is in an on state, inputting, by using the differential circuit, a target signal to the first voltage division branch and the second voltage division branch that are connected in parallel, where the target signal is a first differential output signal output by the first output end or a second differential output signal output by the second output end; receiving the target signal by using the first voltage division branch of the voltage division circuit and performing voltage division according to a first voltage division ratio $k_1$ to output a first voltage signal, and receiving the target signal by using the second voltage division branch and performing voltage division according to a second voltage division ratio $k_2$ to output a second voltage signal, where a difference between the first voltage signal and the second voltage signal is a first deviation signal, and the first deviation signal is used to calibrate a difference between the first voltage division ratio and the second voltage division ratio.

In a possible implementation, when the first calibration switch is in an off state, the first voltage division branch and the second voltage division branch are switched from a parallel-connected state to an open-circuit state. The method further includes: inputting the first differential output signal to the first voltage division branch through the first output end of the differential circuit, and inputting the second differential output signal to the second voltage division branch through the second output end; and receiving the first differential output signal by using the first voltage division branch of the voltage division circuit and performing voltage division according to $k_1$ to output a third voltage signal, and receiving the second differential output signal by using the second voltage division branch and performing voltage division according to $k_2$ to output a fourth voltage signal, where a difference between the third voltage signal and the fourth voltage signal is a first sampling signal.

In a possible implementation, the voltage sampling apparatus further includes a calibration module. The method further includes: obtaining, by using the calibration module, a second sampling signal through calculation based on the first deviation signal and the first sampling signal, where the second sampling signal indicates a difference between voltage signals obtained after voltage division is performed on the first differential output signal and the second differential output signal according to a same voltage division ratio, and the same voltage division ratio is the first voltage division ratio or the second voltage division ratio; and when the target signal is the first differential output signal, restoring, by using the calibration module according to $k_2$, the second sampling signal as a sampling value of a difference between the first differential output signal and the second differential output signal; or when the target signal is the second differential output signal, restoring, by using the calibration module according to $k_1$, the second sampling signal as a sampling value of a difference between the first differential output signal and the second differential output signal.

In a possible implementation, the obtaining, by using the calibration module, a second sampling signal through calculation based on the first deviation signal and the first sampling signal includes: calculating the second sampling signal according to an equation $U_{sampling1}-U_{difference1}(k_1-k_2)-k_2(U_{difference1}-U_{difference2})$ or an equation $U_{sampling1}-U_{difference2}(k_1-k_2)-k_1(U_{difference1}-U_{difference2})$, where $U_{sampling1}$ indicates the first sampling signal, $U_{difference1}$ indicates the first differential output signal, $U_{difference2}$ indicates the second differential output signal, $U_{difference1}(k_1-k_2)$ and $U_{difference2}(k_1-k_2)$ indicate the first deviation signal, and $k_2(U_{difference1}-U_{difference2})$ and $k_1(U_{difference1}-U_{difference2})$ indicate the second differential sampling signal.

In a possible implementation, the differential circuit includes a first switch group and a second switch group, where one end of an $i^{th}$ first switch in the first switch group is connected to a $(2i-1)^{th}$ cell in N series-connected cells, and the other end is connected to the first output end; one end of an $i^{th}$ second switch in the second switch group is connected to a $2i^{th}$ cell in the N series-connected cells, and the other end is connected to the second output end; and N is an integer greater than 1, and i=1, 2, . . . , or N.

In a possible implementation, the first calibration switch is in an on state. The inputting, by using the differential circuit, a target signal to the first voltage division branch and the second voltage division branch that are connected in parallel includes: when the $i^{th}$ first switch is in an on state and the $i^{th}$ second switch is in an off state, receiving, by using the differential circuit, a first differential input signal output by the $(2i-1)^{th}$ cell, and inputting, by using the $i^{th}$ first switch that is switched on, the first differential output signal to the first voltage division branch and the second voltage division branch that are connected in parallel; or when the $i^{th}$ first switch is in an off state and the $i^{th}$ second switch is in an on state, receiving, by using the differential circuit, a second differential input signal output by the $2i^{th}$ cell, and inputting, by using the $i^{th}$ second switch that is switched on, the second differential output signal to the first voltage division branch and the second voltage division branch that are connected in parallel.

In a possible implementation, the first calibration switch is in an off state. The inputting the first differential output signal to the first voltage division branch through the first output end of the differential circuit, and inputting the second differential output signal to the second voltage division branch through the second output end includes: when both the $i^{th}$ first switch and the $i^{th}$ second switch are in an on state, receiving, by using the differential circuit, a first differential input signal output by the $(2i-1)^{th}$ cell and inputting the first differential output signal to the first voltage division branch by using the $i^{th}$ first switch that is switched on, and receiving a second differential input signal output by the $2i^{th}$ cell and inputting the second differential output signal to the second voltage division branch by using the $i^{th}$ second switch that is switched on.

In a possible implementation, the voltage sampling apparatus further includes a second calibration switch. One end of the second calibration switch is connected to the first end of the first calibration switch, and the other end is connected to a reference power supply. When both the $i^{th}$ first switch and the $i^{th}$ second switch are in an off state, and the first calibration switch and the second calibration switch are in an on state, the method further includes: receiving, by using the second voltage division branch of the voltage division circuit, a reference voltage signal output by the reference power supply, and performing voltage division according to $k_2$ to output a fifth voltage signal, where the fifth voltage signal is used to calibrate $k_2$.

In a possible implementation, the restoring, according to $k_2$, the second sampling signal as a sampling value of a difference between the first differential output signal and the second differential output signal when the target signal is the first differential output signal includes: when the target signal is the first differential output signal, restoring, by using the calibration module according to the calibrated $k_2$, the second sampling signal as the sampling value of the difference between the first differential output signal and the second differential output signal.

In a possible implementation, when the $i^{th}$ first switch, the $i^{th}$ second switch, and the first calibration switch are all in an off state, and the second calibration switch is in an on state, the method further includes: receiving, by using the first voltage division branch of the voltage division circuit, the reference voltage signal output by the reference power supply, and performing voltage division according to $k_1$ to output a sixth voltage signal, where the sixth voltage signal is used to calibrate $k_1$.

In a possible implementation, the restoring, according to $k_1$, the second sampling signal as a sampling value of a difference between the first differential output signal and the second differential output signal when the target signal is the second differential output signal includes: when the target signal is the second differential output signal, restoring, by using the calibration module according to the calibrated $k_1$, the second sampling signal as the sampling value of the difference between the first differential output signal and the second differential output signal.

In a possible implementation, a ground end of the first voltage division branch and a ground end of the second voltage division branch are both connected to a ground cable. The first voltage division branch includes M series-connected first voltage division resistors, the second voltage division branch includes M series-connected second voltage division resistors, and M is an integer greater than 1. When the first calibration switch is in an on state, the receiving the target signal by using the first voltage division branch of the voltage division circuit and performing voltage division to output a first voltage signal, and receiving the target signal by using the second voltage division branch and performing voltage division to output a second voltage signal includes: performing, by using the M series-connected first voltage division resistors of the voltage division circuit, voltage division on the target signal according to $k_1$ to output the first voltage signal, and performing, by using the M series-connected second voltage division resistors, voltage division on the target signal according to $k_2$ to output the second voltage signal.

In a possible implementation, when the first calibration switch is in an off state, the receiving the first differential output signal by using the first voltage division branch of the voltage division circuit and performing voltage division to output a third voltage signal, and receiving the second differential output signal by using the second voltage division branch and performing voltage division to output a fourth voltage signal includes: performing, by using the M series-connected first voltage division resistors of the voltage division circuit, voltage division on the first differential output signal according to $k_1$ to output the third voltage signal, and performing, by using the M series-connected second voltage division resistors, voltage division on the second differential output signal according to $k_2$ to output the fourth voltage signal.

In a possible implementation, the voltage sampling apparatus further includes an analog-to-digital converter. The method further includes: receiving, by using the analog-to-digital converter, an output signal of the voltage division circuit, and converting the output signal from an analog signal into a digital signal, where the output signal includes the first voltage signal and the second voltage signal, or the third voltage signal and the fourth voltage signal, or the fifth voltage signal, or the sixth voltage signal.

According to a third aspect, this application provides a terminal device. The terminal device has a function of implementing the method according to any one of the foregoing voltage sampling method embodiments. The function may be implemented by hardware, or may be implemented by hardware executing corresponding software. The hardware or the software includes one or more modules corresponding to the function.

According to a fourth aspect, this application provides a terminal device. The terminal device includes a processor. The processor is configured to support the terminal device in performing a corresponding function in the voltage sampling method provided in the second aspect. The terminal device may further include a memory. The memory is coupled to the processor, and stores program instructions and data that are necessary for the terminal device. The terminal device may further include a communication interface, configured to implement communication between the terminal device and another device or a communication network.

According to a fifth aspect, an embodiment of the present disclosure provides a computer program. The computer program includes instructions. When the computer program is executed by a computer, the computer is enabled to perform a procedure in the voltage sampling method according to any one of the implementations of the second aspect.

According to a sixth aspect, this application provides a chip system. The chip system includes a processor, configured to support an application server or a terminal device in implementing a function in the foregoing aspects, for example, generating or processing information in the foregoing methods. In a possible design, the chip system further includes a memory. The memory is configured to store program instructions and data that are necessary for a data sending device. The chip system may include a chip, or may include a chip and another discrete component.

According to a seventh aspect, this application provides a semiconductor chip. The semiconductor chip includes the voltage sampling apparatus according to any one of the implementations of the first aspect.

According to an eighth aspect, this application provides an electronic device. The electronic device includes the semiconductor chip according to the seventh aspect.

BRIEF DESCRIPTION OF DRAWINGS

FIG. 6 is a flowchart of a voltage sampling method according to an embodiment of the present disclosure.

DESCRIPTION OF EMBODIMENTS

Figure 1A:
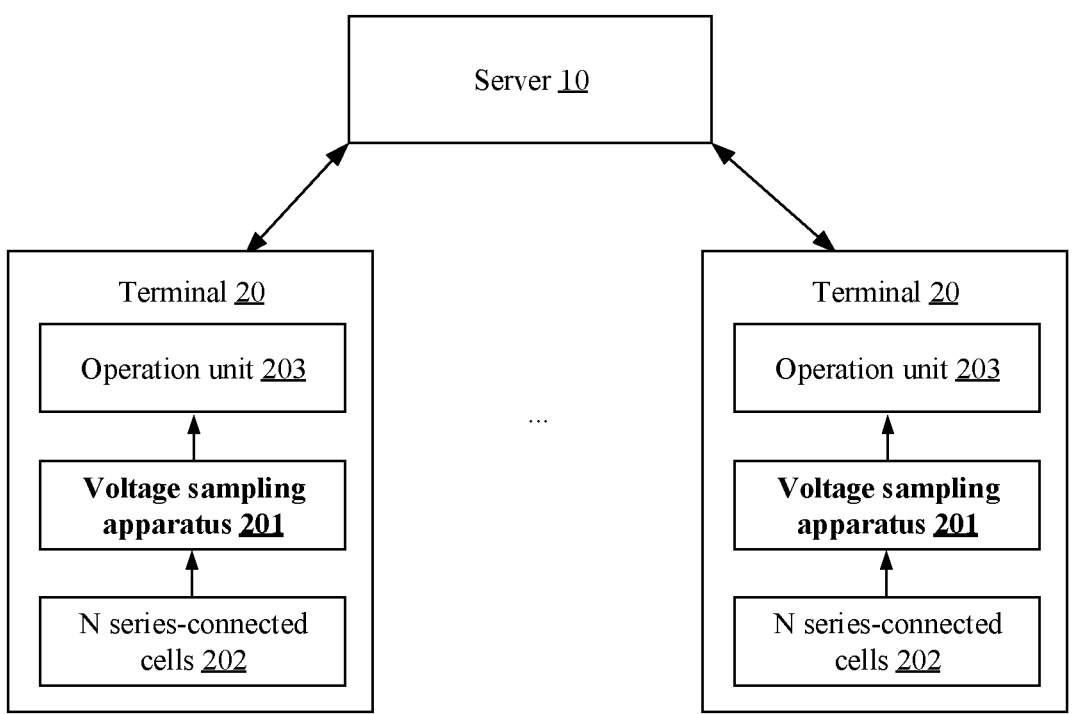
FIG. 1A is a schematic diagram of a system architecture of an application scenario of a voltage sampling apparatus according to an embodiment of the present disclosure.

The following describes embodiments of the present disclosure with reference to the accompanying drawings. In the specification, claims, and accompanying drawings of this application, the terms "first", "second", "third", "fourth" and the like are intended to distinguish between different objects but do not indicate a particular order. In addition, the terms "including" and "having" and any other variants thereof are intended to cover a non-exclusive inclusion. For example, a process, a method, a system, a product, or a device that includes a series of steps or units is not limited to the listed steps or units, but optionally further includes an unlisted step or unit, or optionally further includes another inherent step or unit of the process, the method, the product, or the device.

An "embodiment" mentioned in this specification means that a particular characteristic, structure, or feature described with reference to embodiments may be included in at least one embodiment of this application. The phrase shown in various locations in the specification may not necessarily refer to a same embodiment, and is not an independent or optional embodiment exclusive from another embodiment. It is explicitly and implicitly understood by a person skilled in the art that embodiments described in the specification may be combined with another embodiment.

The following describes some terms in this application to help a person skilled in the art have a better understanding.

(1) "A plurality of" means two or more than two. The term "and/or" describes an association relationship for describing associated objects and represents that three relationships may exist. For example, A and/or B may represent the following three cases: Only A exists, both A and B exist, and only B exists. The character "/" generally indicates an "or" relationship between the associated objects.

(2) A differential circuit is a circuit with the characteristic of "suppressing common-mode signals and amplifying differential-mode signals". Two signals are input at an input end of the circuit, a difference between the two signals is an effective input signal of the circuit, and the difference between the two input signals is amplified at an output of the circuit. In a scenario, if there is an interference signal, same interference is generated on the two input signals, and an effective input of the interference signal is zero due to the difference between the two signals, so that common-mode interference is resisted.

(3) A voltage division principle means that in a voltage division branch (including, for example, a plurality of series-connected resistors), currents on the resistors are equal, and a sum of voltages at both ends of the resistors is equal to a total voltage of the circuit. For example, it is assumed that the voltage division branch includes two series-connected resistors, that is, R1 and R2. In this case, $R1:R2=U1:U2$ can be obtained according to a voltage division principle.

(4) Voltage division is a technology in which voltage signals in the circuit are regulated and controlled according to the voltage division principle, namely, a technology in which voltage division and outputting are performed on an input voltage signal of the voltage division branch according to a voltage division ratio. For example, it is assumed that the voltage division branch includes two series-connected resistors, that is, R1 and R2. In this case, a voltage division coefficient may be $$k = \frac{R1}{R1 + R2}.$$

When the voltage division branch receives an input voltage signal $U_{input}$, the voltage division branch can perform voltage division on $U_{input}$ and output $k \times U_{input}$, to regulate and control the input voltage signal.

The following describes embodiments of this application with reference to the accompanying drawings.

Figure 1B:
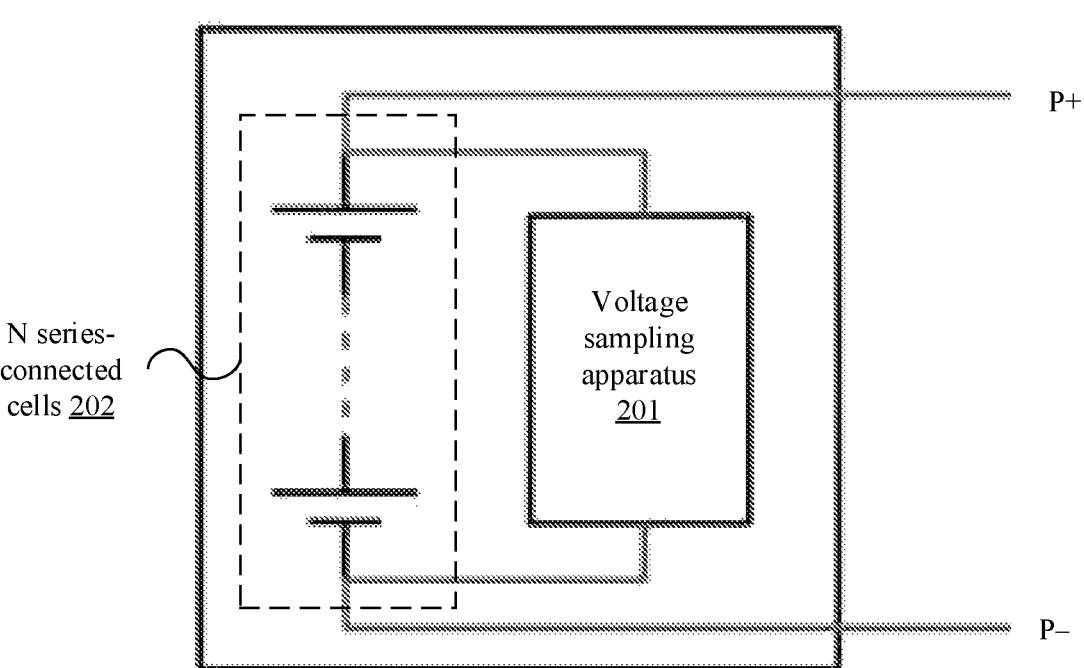
FIG. 1B is a schematic diagram of a battery product according to an embodiment of the present disclosure.

Refer to FIG. 1A. FIG. 1A is a schematic diagram of a system architecture of an application scenario of a voltage sampling apparatus according to an embodiment of the present disclosure. The system architecture includes at least one server 10 and one or more terminals 20 (two terminals are used as an example in the figure). The server 10 generates a preset algorithm for analyzing a voltage signal. The terminal 20 may include a voltage sampling apparatus 201, N series-connected cells 202, and an operation unit 203 in this application. The operation unit 203 may analyze, according to the preset algorithm provided by the server 10, voltage signals that are of the N series-connected cells 202 and that are collected by the voltage sampling apparatus 201, to predict power supply capabilities of the N series-connected cells 202 or perform battery management. The terminal 20 in the system architecture may be specifically at least one of a battery-powered device such as a smartphone, a communication base station, a data center, a photovoltaic inverter, or an electric vehicle. Optionally, the battery-powered device includes at least one battery product. The battery product includes the N series-connected cells 202 and the voltage sampling apparatus 201. For example, as shown in FIG. 1B, FIG. 1B is a schematic diagram of a battery product according to an embodiment of the present disclosure. In FIG. 1B, the N series-connected cells 202 of the battery product are used as a power supply system. The voltage sampling apparatus 201 is connected to the N series-connected cells 202, and is configured to collect voltage signals of the N series-connected cells 202.

For example, before the terminal 20 (for example, a smartphone) in FIG. 1A is delivered from a factory, the server 10 (for example, a firmware ROM flashing server) pre-installs firmware in batches on another terminal 20 of a same model as the terminal. The firmware may include a preset algorithm for analyzing a voltage signal. The preset algorithm may be stored in an internal storage unit of the terminal 20, for example, a read-only memory (Read-Only Memory, ROM), namely, a default place in which system firmware and software of the terminal 20 are installed. In addition, before a root (root) permission is obtained, the firmware (including the preset algorithm) cannot be randomly read or written. After the terminal 20 is delivered from a factory, considering that different cells in the N series-connected cells 202 are inconsistent, as a charge-discharge cycle of each cell increases, a voltage of each individual cell is gradually divided, which greatly shortens a battery life. Therefore, the voltage sampling apparatus 201 in this application may periodically collect a voltage signal of each individual cell of the N series-connected cells 202, and analyze and manage the sampled voltage signals by using the operation unit 203 according to the preset algorithm, so that a voltage deviation of a single cell can be kept within an expected range. This ensures that each individual cell is not damaged during proper use, and ensures safety and stability of the N series-connected cells 202.

It may be understood that the system architecture corresponding to the foregoing application scenario is merely several example implementations in embodiments of the present disclosure. The application scenario and the corresponding system architecture in embodiments of the present disclosure include but are not limited to the foregoing descriptions.

Figure 2A:
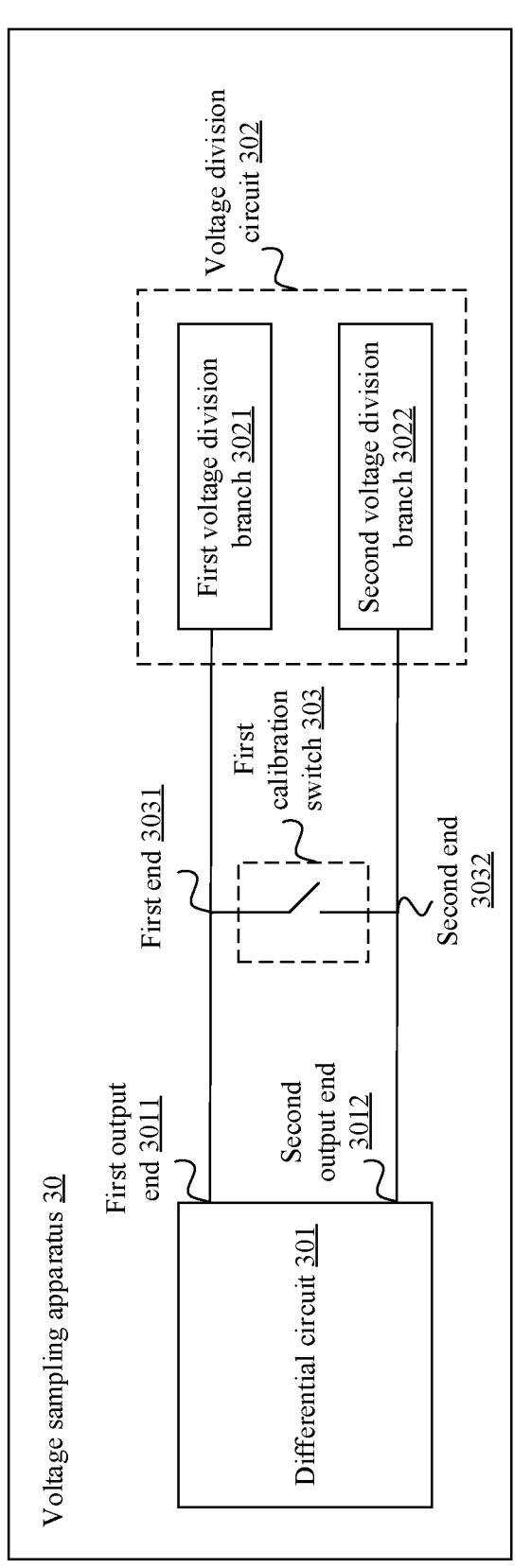
FIG. 2A is a schematic diagram of a voltage sampling apparatus according to an embodiment of the present disclosure.

The following provides a related apparatus according to an embodiment of the present disclosure. Refer to FIG. 2A. FIG. 2A is a schematic diagram of a voltage sampling apparatus according to an embodiment of the present disclosure. As shown in FIG. 2A, the voltage sampling apparatus 30 includes a differential circuit 301, a voltage division circuit 302, and a first calibration switch 303. The voltage division circuit 302 includes a first voltage division branch 3021 and a second voltage division branch 3022. A first output end 3011 of the differential circuit 301 and an input end of the first voltage division branch 3021 are connected to a first end 3031 of the first calibration switch 303. A second output end 3012 of the differential circuit 301 and an input end of the second voltage division branch 3022 are connected to a second end 3032 of the first calibration switch 303.

Figure 2B:
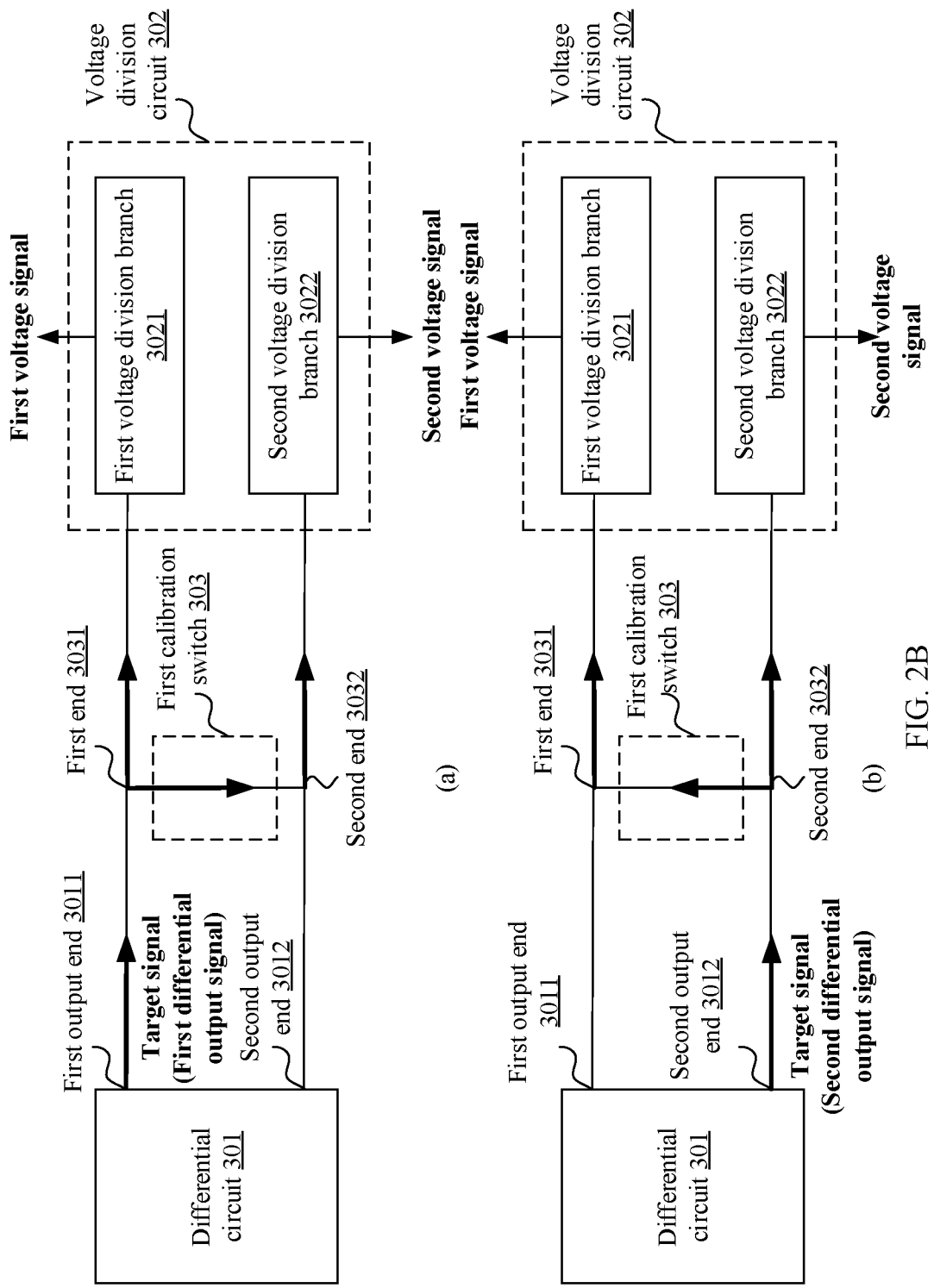
FIG. 2B is a schematic diagram of a voltage signal calibration process according to an embodiment of the present disclosure.

When the first calibration switch 303 is in an on state, the first voltage division branch 3021 and the second voltage division branch 3022 are connected in parallel, and the differential circuit 301 is configured to: input a target signal to the first voltage division branch 3021 and the second voltage division branch 3022 that are connected in parallel, where the target signal is a first differential output signal output by the first output end 3011 or a second differential output signal output by the second output end 3012. Specifically, refer to FIG. 2B. FIG. 2B is a schematic diagram of a voltage signal calibration process according to an embodiment of the present disclosure. As shown in FIG. 2B, when the first calibration switch 303 is in an on state, the first voltage division branch 3021 and the second voltage division branch 3022 are in a parallel-connected state. In other words, voltages at two ends of the first voltage division branch 3021 and the second voltage division branch 3022 are the same. Because the differential circuit 301 has two signal output ends, there are two methods for outputting a target signal. In a first method, as shown in (a) in FIG. 2B, the differential circuit 301 outputs a first differential output signal as a target signal through the first output end 3011 and separately inputs the first differential output signal to the first voltage division branch 3021 and the second voltage division branch 3022. In a second method, as shown in (b) in FIG. 2B, the differential circuit 301 outputs a second differential output signal as a target signal through the second output end 3012 and separately inputs the second differential output signal to the first voltage division branch 3021 and the second voltage division branch 3022. It may be understood that different output ends of the differential circuit 301 output different voltage signals. Therefore, the target signal is the first differential output signal output by the first output end 3011, or the second differential output signal output by the second output end 3012.

The voltage division circuit 302 is configured to: receive the target signal by using the first voltage division branch 3021 and perform voltage division according to a first voltage division ratio $k_1$ to output a first voltage signal, and receive the target signal by using the second voltage division branch 3022 and perform voltage division according to a second voltage division ratio $k_2$ to output a second voltage signal, where a difference between the first voltage signal and the second voltage signal is a first deviation signal, and the first deviation signal is used to calibrate a difference between the first voltage division ratio and the second voltage division ratio. Specifically, according to the two methods for outputting the target signal by the differential circuit 301, for the first method, as shown in (a) in FIG. 2B, the first voltage division branch 3021 of the voltage division circuit 302 receives the first differential output signal (the target signal) output by the first output end 3011, and performs voltage division on the signal by using a voltage division element in the first voltage division branch 3021 according to the first voltage division ratio to output the first voltage signal. The second voltage division branch 3022 of the voltage division circuit 302 receives the first differential output signal output by the first output end 3011, and performs voltage division on the signal by using a voltage division element in the second voltage division branch 3022 according to the second voltage division ratio to output the second voltage signal. For the second method, as shown in (b) in FIG. 2B, the first voltage division branch 3021 of the voltage division circuit 302 receives the second differential output signal (the target signal) output by the second output end 3012, and performs voltage division on the signal by using a voltage division element in the first voltage division branch 3021 according to the first voltage division ratio to output the first voltage signal. The second voltage division branch 3022 of the voltage division circuit 302 receives the second differential output signal output by the second output end 3012, and performs voltage division on the signal by using a voltage division element in the second voltage division branch 3022 according to the second voltage division ratio to output the second voltage signal. Then, the first deviation signal is obtained based on the first voltage signal and the second voltage signal. It may be understood that because the first deviation signal is a difference between two voltage signals that are actually obtained through measurement, the first deviation signal may indicate a deviation between an actual voltage division capability of the first voltage division branch 3021 and an actual voltage division capability of the second voltage division branch 3022.

For example, it is assumed that the voltage division ratio ($k_1$) of the first voltage division branch 3021 is the same as the voltage division ratio ($k_2$) of the second voltage division branch 3022, that is, $k_1=k_2$. When the first calibration switch is in an on state, the first voltage division branch 3021 and the second voltage division branch 3022 are in a parallel-connected state. In this case, the differential circuit 301 may input the same target signal to the first voltage division branch 3021 and the second voltage division branch 3022. Because the voltage division ratios of the two branches are theoretically equal, the difference between the voltage signals respectively output by the two voltage division branches in an ideal state is zero ($k_1 \times U_{target} - k_2 \times U_{target} = 0$). However actually, because there is a specific error between a theoretical resistance value and an actual resistance value of the resistor in each voltage division branch, there is an error between a theoretical value and an actual value of $k_1$, and there is an error between a theoretical value and an actual value of $k_2$. As a result, there is an error in the difference between $k_1$ and $k_2$, that is, actually $k_1 - k_2 = \Delta k$, and $\Delta k$ is not 0. In conclusion, due to the error, a voltage division capability of the first voltage division branch 3021 is different from a voltage division capability of the second voltage division branch 3022. When the difference between the voltage signals actually provided by the differential circuit is restored according to the theoretical voltage division ratio based on the voltage signal sampled by a sampling chip, a restoration result is affected by an error obtained after errors of the two voltage division ratios are superimposed. This reduces sampling precision of the voltage sampling apparatus. Therefore, to avoid impact on sampling precision caused by different voltage division capabilities of the two voltage division branches, in this embodiment of the present disclosure, the first calibration switch 303 is switched on, so that the first voltage division branch 3021 and the second voltage division branch 3022 are in a parallel-connected state, and the first voltage division branch 3021 and the second voltage division branch 3022 separately receive a target signal $U_{target}$ (the first differential output signal or the second differential output signal) output by the differential circuit 3031, so that the difference (the first deviation signal) of the voltage signals output by the voltage division circuit 302 can be actually measured, where the first deviation signal may indicate a deviation between the voltage division capabilities of the two voltage division branches. Therefore, the deviation is superimposed on one of the voltage division branches, so that the voltage division capabilities of the two voltage division branches are equal. Further, sampling precision originally determined by superimposing two error factors (a first voltage division ratio error and a second voltage division ratio error) is converted into sampling precision determined by one error factor (the first voltage division ratio error or the second voltage division ratio error). That is, the error factor is reduced. Subsequently, only one error factor is used for calibration, so that sampling precision can be improved.

In a possible implementation, as shown in FIG. 2A, when the first calibration switch 303 is in an off state, the first voltage division branch 3021 and the second voltage division branch 3022 are switched from a parallel-connected state to an open-circuit state. The differential circuit 301 is further configured to: input the first differential output signal to the first voltage division branch 3021 through the first output end 3011, and input the second differential output signal to the second voltage division branch 3022 through the second output end 3012. The voltage division circuit 302 is further configured to: receive the first differential output signal by using the first voltage division branch 3021 and perform voltage division according to $k_1$ to output a third voltage signal, and receive the second differential output signal by using the second voltage division branch 3022 and perform voltage division according to $k_2$ to output a fourth voltage signal, where a difference between the third voltage signal and the fourth voltage signal is a first sampling signal. Specifically, as shown in FIG. 2A, when the first calibration switch 303 is switched from an on state to an off state, the first voltage division branch 3021 and the second voltage division branch 3022 in the voltage division circuit 302 are switched from a parallel-connected state to an open-circuit state, so that the first voltage division branch 3021 and the second voltage division branch 3022 can separately receive different voltage signals and perform voltage division, to output a voltage signal that meets a withstand voltage limitation condition of the chip, to obtain the first sampling signal.

In a possible implementation, the voltage sampling apparatus 30 further includes a calibration module. The calibration module is configured to: obtain a second sampling signal through calculation based on the first deviation signal and the first sampling signal, where the second sampling signal indicates a difference between voltage signals obtained after voltage division is performed on the first differential output signal and the second differential output signal according to a same voltage division ratio, and the same voltage division ratio is the first voltage division ratio or the second voltage division ratio; and when the target signal is the first differential output signal, restore, according to $k_2$, the second sampling signal as a sampling value of a difference between the first differential output signal and the second differential output signal; or when the target signal is the second differential output signal, restore, according to $k_1$, the second sampling signal as a sampling value of a difference between the first differential output signal and the second differential output signal. Specifically, the calibration module may remove, based on the first sampling signal, the foregoing first deviation signal (namely, a sampling error caused by inconsistent voltage division capabilities of the two voltage division branches) to obtain the second sampling signal, so that the sampling error caused by the inconsistent voltage division capabilities of the two voltage division branches is effectively eliminated. In other words, the sampling precision originally determined by superimposing the two error factors (namely, the first voltage division ratio error and the second voltage division ratio error) is converted into the sampling precision determined by one error factor (namely, the first voltage division ratio error or the second voltage division ratio error). The error factor is reduced. Further, the second sampling signal is restored, according to the theoretical voltage division ratio, as the sampling value of the difference between the two voltage signals actually output by the differential circuit. This avoids the sampling error caused by the inconsistent voltage division capabilities of the two voltage division branches, and improves sampling precision.

In a possible implementation, the calibration module is specifically configured to: calculate the second sampling signal according to an equation $U_{sampling1}-U_{difference1}(k_1-k_2)-k_2(U_{difference1}-U_{difference2})$ or an equation $U_{sampling1}-U_{difference2}(k_1-k_2)-k_1(U_{difference1}-U_{difference2})$, where $U_{sampling1}$ indicates the first sampling signal, $U_{difference1}$ indicates the first differential output signal, $U_{difference2}$ indicates the second differential output signal, $U_{difference1}(k_1-k_2)$ and $U_{difference2}(k_1-k_2)$ indicate the first deviation signal, and $k_2(U_{difference1}-U_{difference2})$ and $k_1(U_{difference1}-U_{difference2})$ indicate the second differential sampling signal.

For example, it is assumed that the voltage division ratio (k₁) of the first voltage division branch 3021 is the same as the voltage division ratio (k₂) of the second voltage division branch 3022, that is, theoretically $k_1=k_2$. When the first calibration switch 303 is switched from an on state to an off state, the first voltage division branch 3021 and the second voltage division branch 3022 are switched from a parallel-connected state to an open-circuit state. The first voltage division branch 3021 receives the first differential voltage signal ($U_{difference1}$) and performs voltage division to obtain the third voltage signal ($k_1 \times U_{difference1}$). The second voltage division branch 3022 receives the second differential voltage signal ($U_{difference2}$) and performs voltage division to obtain the fourth voltage signal ($k_2 \times U_{difference2}$). In this case, the first sampling signal is a difference between the third voltage signal and the fourth voltage signal, that is, $U_{sampling}=k_1 \times U_{difference1}-k_2 \times U_{difference2}$. Further, in a theoretical state, it is assumed that a theoretical voltage division ratio of the voltage division element is K, that is, $K=k_1=k_2$. When the difference between the voltage signals actually provided by the differential circuit 301 is restored according to the theoretical voltage division ratio, the following equation 1 may be used:

$$U_{difference1} - U_{difference2} =$$
$$k_1 \times U_{difference1} \times \frac{1}{K} - k_2 \times U_{difference2} \times \frac{1}{K} \quad \text{(equation 1)}$$

Figure 2C:
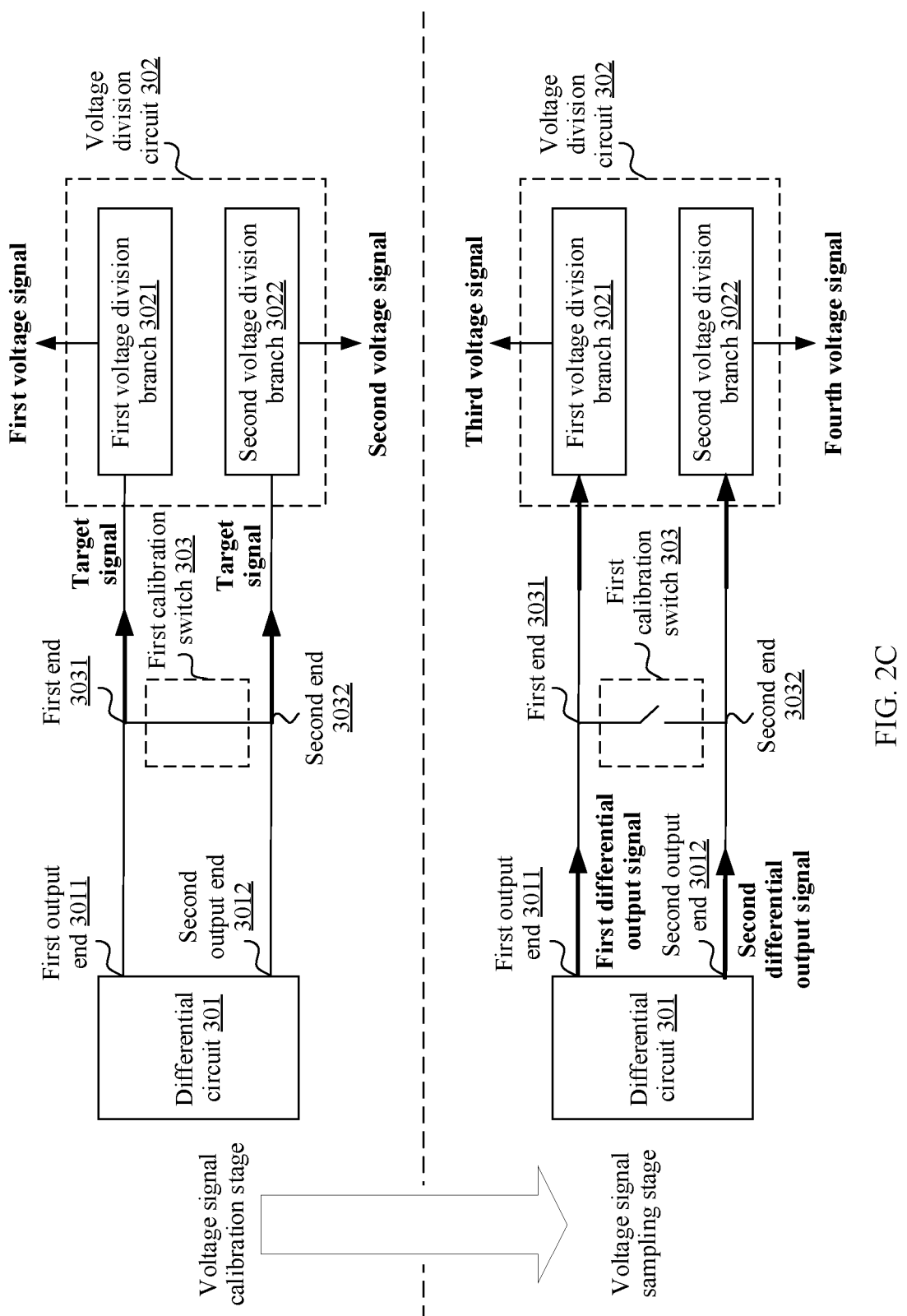
FIG. 2C is a schematic diagram of a voltage signal sampling process according to an embodiment of the present disclosure.

However actually, due to differences in manufacturing techniques or other environmental factors of the voltage division element, values of K, k₁, and k₂ are not equal. Therefore, an error exists between the difference, obtained through calculation according to the equation 1, of the voltage signals output by the differential circuit 301 and the actual difference of the voltage signals output by the differential circuit 301. In this embodiment of the present disclosure, refer to FIG. 2C. FIG. 2C is a schematic diagram of a voltage signal sampling process according to an embodiment of the present disclosure. As shown in FIG. 2C, in a voltage signal calibration stage, a first deviation signal, namely, a value of $U_{difference1}(k_1-k_2)$ or a value of $U_{difference2}$ $(k_1-k_2)$, can be obtained based on the first voltage signal output by the first voltage division branch 3021 and the second voltage signal output by the second voltage division branch 3022. In a voltage signal sampling stage, a differential sampling signal can be obtained based on the third voltage signal output by the first voltage division branch 3021 and the fourth voltage signal output by the second voltage division branch 3022, that is, $U_{sampling}=k_1 \times U_{difference1}-k_2 \times U_{difference2}$.

Further, the calibration module restores, according to the voltage division ratio, the difference of the voltage signals actually provided by the differential circuit 301. When the target signal is the first differential output signal, the first deviation signal is represented by $U_{difference1}(k_1-k_2)$, as shown in the following equation 2:

$$U_{sampling1}-U_{difference1}(k_1-k_2)=k_2(U_{difference1}-U_{difference2}) \quad \text{(equation 2)}$$

Based on theoretical values of the equation 2 and k₂, a more actual difference ($U_{difference1}-U_{difference2}$) of the voltage signals output by the differential circuit 301 can be calculated. When the target signal is the second differential output signal, the first deviation signal is represented by $U_{difference2}(k_1-k_2)$, as shown in the following equation 3:

$$U_{sampling1}-U_{difference2}(k_1-k_2)=k_1(U_{difference1}-U_{difference2}) \quad \text{(equation 3)}$$

Similarly, based on theoretical values of the equation 3 and k₁, a more actual difference ($U_{difference1}-U_{difference2}$) of the voltage signals output by the differential circuit 301 can be calculated.

According to the voltage sampling apparatus provided in this embodiment of the present disclosure, when the first calibration switch 303 is in an on state, the deviation signal of the two branches can be obtained; and when the first calibration switch 303 is in an off state, the first sampling signal can be obtained. The first sampling signal can be calibrated based on the deviation signal. This effectively eliminates a sampling error caused by inconsistent voltage division capabilities of the two voltage division branches, and improves sampling precision.

Figure 2D:
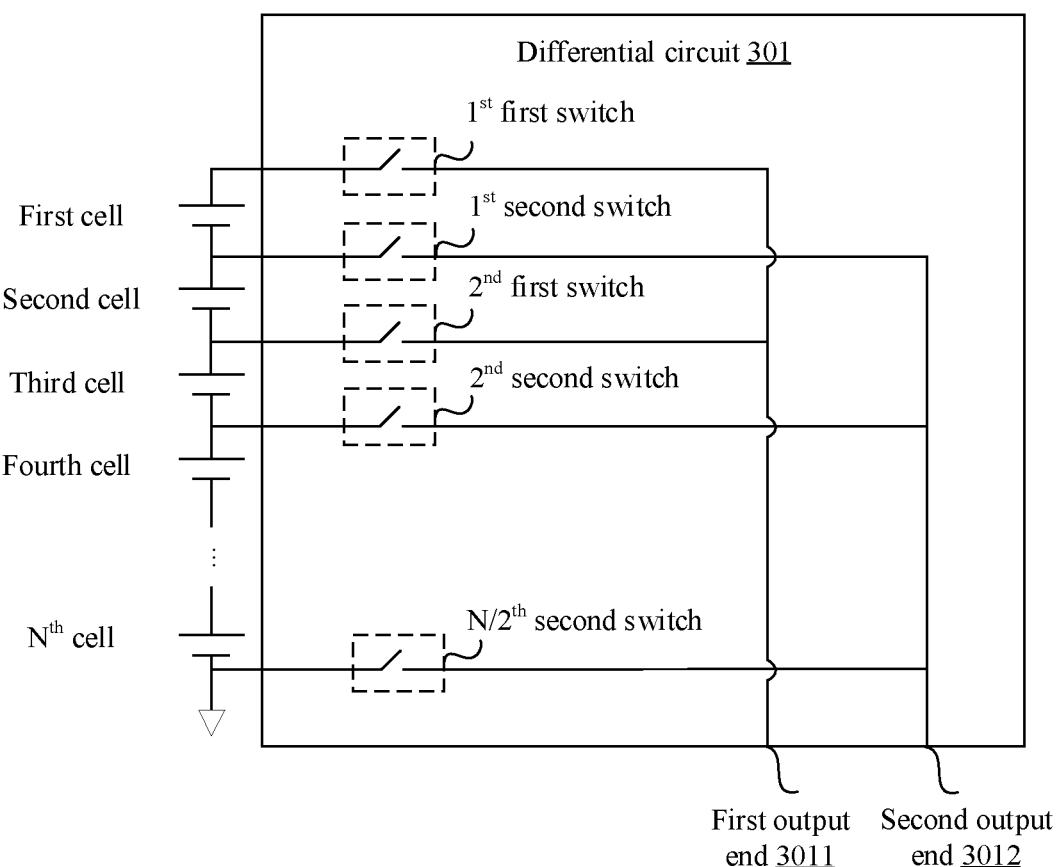
FIG. 2D is a schematic diagram of a differential circuit according to an embodiment of the present disclosure.

In a possible implementation, the differential circuit 301 in FIG. 2A may include a first switch group and a second switch group, where one end of an $i^{th}$ first switch in the first switch group is connected to a $(2i-1)^{th}$ cell in N series-connected cells, and the other end is connected to the first output end 3011; one end of an $i^{th}$ second switch in the second switch group is connected to a $2i^{th}$ cell in the N series-connected cells, and the other end is connected to the second output end 3012; and N is an integer greater than 1, and i=1, 2, . . . , or N. Specifically, because multiple paths of differential sampling need to be performed on the N series-connected cells, the first switch group and the second switch group may be designed in the differential circuit 301. The first switch group may be configured to control a voltage signal flow direction of an odd-numbered cell, and the second switch group may be configured to control a voltage signal flow direction of an even-numbered cell. For example, as shown in FIG. 2D, FIG. 2D is a schematic diagram of a differential circuit according to an embodiment of the present disclosure. It is assumed that N is an even number. In the figure, one end of each first switch in the first switch group is connected to an odd-numbered cell in the N series-connected cells, and the other ends are jointly connected to the first output end 3011. One end of each second switch in the second switch group is connected to an even-numbered cell in the N series-connected cells, and the other ends are jointly connected to the second output end 3012.

In a possible implementation, the first calibration switch 303 in FIG. 2A is in an on state; and when the i$^{th}$ first switch is in an on state and the i$^{th}$ second switch is in an off state, the differential circuit 301 is specifically configured to: receive a first differential input signal output by the $(2i-1)^{th}$ cell, and input, by using the i$^{th}$ first switch that is switched on, the first differential output signal to the first voltage division branch 3021 and the second voltage division branch 3022 that are connected in parallel; or when the i$^{th}$ first switch is in an off state and the i$^{th}$ second switch is in an on state, the differential circuit 301 is specifically configured to: receive a second differential input signal output by the 2i$^{th}$ cell, and input, by using the i$^{th}$ second switch that is switched on, the second differential output signal to the first voltage division branch 3021 and the second voltage division branch 3022 that are connected in parallel. Specifically, when the first calibration switch 303 is switched on, the voltage sampling apparatus 30 is in a voltage signal calibration stage. The first voltage division branch 3021 and the second voltage division branch 3022 receive only one same voltage signal (the target signal mentioned above). Therefore, the i$^{th}$ first switch may be switched on, and the i$^{th}$ second switch may be switched off, to ensure that only a voltage signal of the $(2i-1)^{th}$ cell is input to the differential circuit 301, and the differential circuit 301 outputs only the first differential output signal. Alternatively, the i$^{th}$ second switch may be switched on, and the i$^{th}$ first switch may be switched off, to ensure that only a voltage signal of the 2i$^{th}$ cell is input to the differential circuit 301, and the differential circuit 301 outputs only the second differential output signal. For example, when a voltage signal of a first cell needs to be collected, as shown in FIG. 2D, a 1$^{st}$ first switch may be switched on, and a 1$^{st}$ second switch may be switched off, to input a voltage signal of the first cell to the differential circuit 301 to obtain the first differential output signal; or a 1$^{st}$ second switch may be switched on, and a 1$^{st}$ first switch is switched off, to input a voltage signal of a second cell to the differential circuit 301 to obtain the second differential output signal. In conclusion, the deviation signal is obtained based on the first differential output signal or the deviation signal is obtained based on the second differential output signal. The deviation signals can calibrate an error of a difference between the voltage division ratios provided by the two voltage division branches.

Figure 2E:
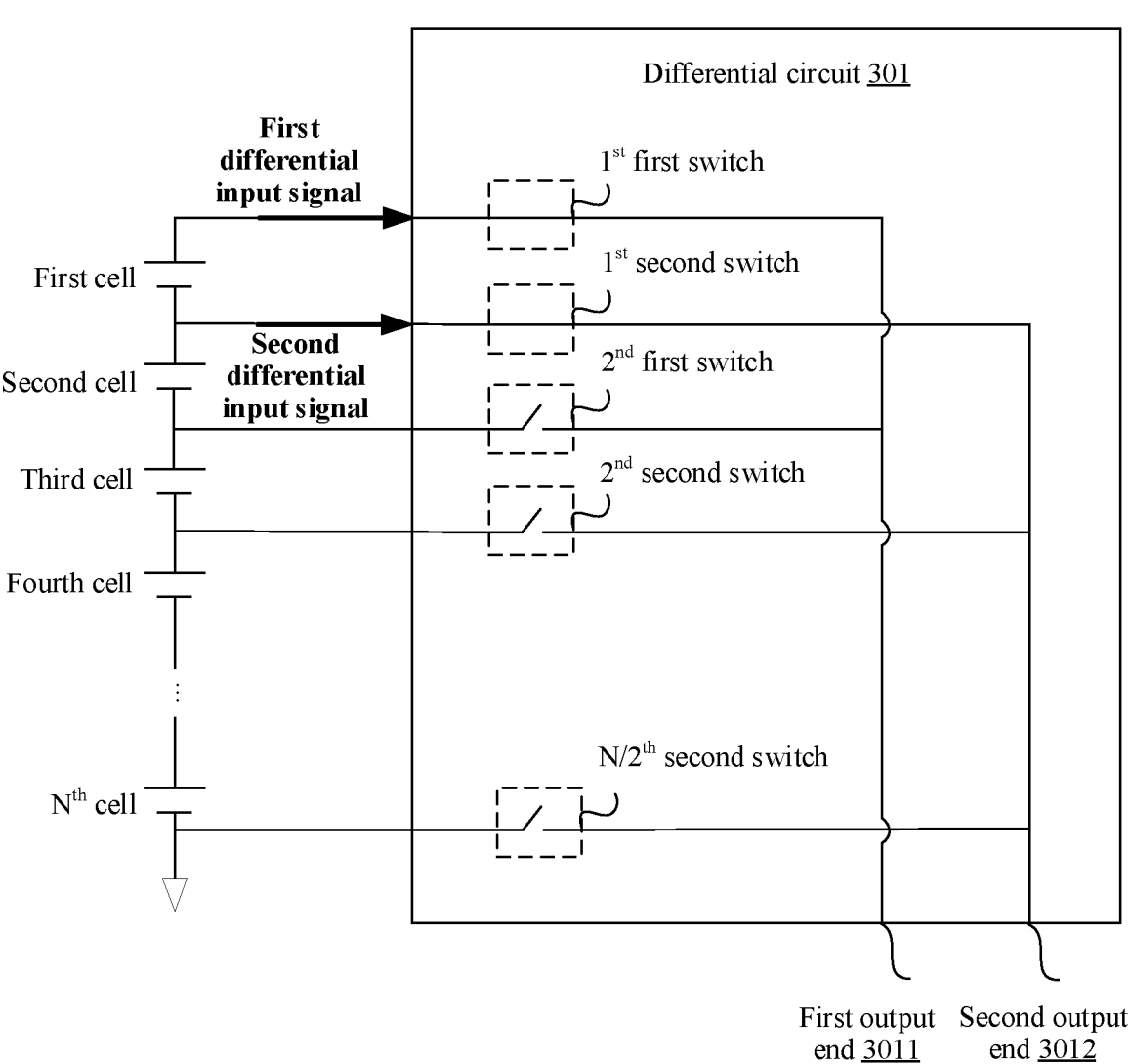
FIG. 2E is a schematic diagram of a differential circuit in a voltage signal sampling stage according to an embodiment of the present disclosure.

In a possible implementation, the first calibration switch 303 in FIG. 2A is in an off state; and when both the i$^{th}$ first switch and the i$^{th}$ second switch are in an on state, the differential circuit 301 is specifically configured to: receive a first differential input signal output by the $(2i-1)^{th}$ cell and input the first differential output signal to the first voltage division branch 3021 by using the i$^{th}$ first switch that is switched on, and receive a second differential input signal output by the 2i$^{th}$ cell and input the second differential output signal to the second voltage division branch 3022 by using the i$^{th}$ second switch that is switched on. Specifically, when the first calibration switch 303 is switched off, the voltage sampling apparatus 30 is in a voltage signal sampling stage. The first voltage division branch 3021 and the second voltage division branch 3022 receive two different voltage signals. Therefore, the i$^{th}$ first switch and the i$^{th}$ second switch may be switched on, to ensure that the differential circuit 301 can separately receive voltage signals of the $(2i-1)^{th}$ cell and the 2i$^{th}$ cell, and the differential circuit 301 can separately output two differential output signals (obtained based on the voltage signals of the $(2i-1)^{th}$ cell and the 2i$^{th}$ cell). For example, as shown in FIG. 2E, FIG. 2E is a schematic diagram of a differential circuit in a voltage signal sampling stage according to an embodiment of the present disclosure. In the voltage signal sampling stage, the 1$^{st}$ first switch and the 1$^{st}$ second switch are switched on, the voltage signal of the first cell is used as a first differential input signal, and the differential circuit 301 outputs a first differential output signal from the first output end 3011 based on the first differential input signal. The voltage signal of the second cell is used as a second differential input signal, and the differential circuit 301 outputs a second differential output signal from the second output end 3012 based on the second differential input signal.

Figure 2F:
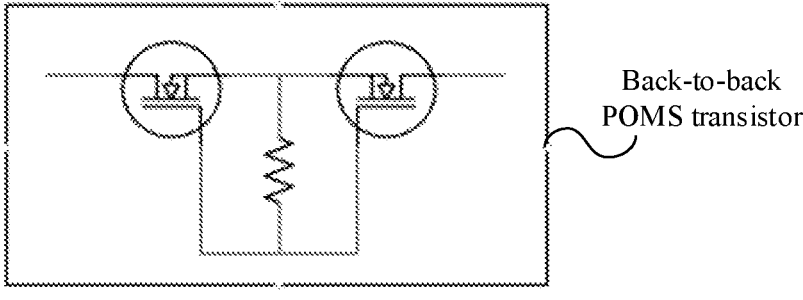
FIG. 2F is a schematic diagram of a back-to-back PMOS transistor according to an embodiment of the present disclosure.

Optionally, refer to FIG. 2F. FIG. 2F is a schematic diagram of a back-to-back PMOS transistor according to an embodiment of the present disclosure. Because the back-to-back POMS transistor shown in the figure can prevent current backflow, the switches in the first switch group and the second switch group mentioned above may be specifically the back-to-back POMS transistor in the figure, to avoid current backflow to a cell.

According to the voltage sampling apparatus 30 in FIG. 2A, the apparatus is further optimized in the following descriptions, and is described in detail below.

Figure 3A:
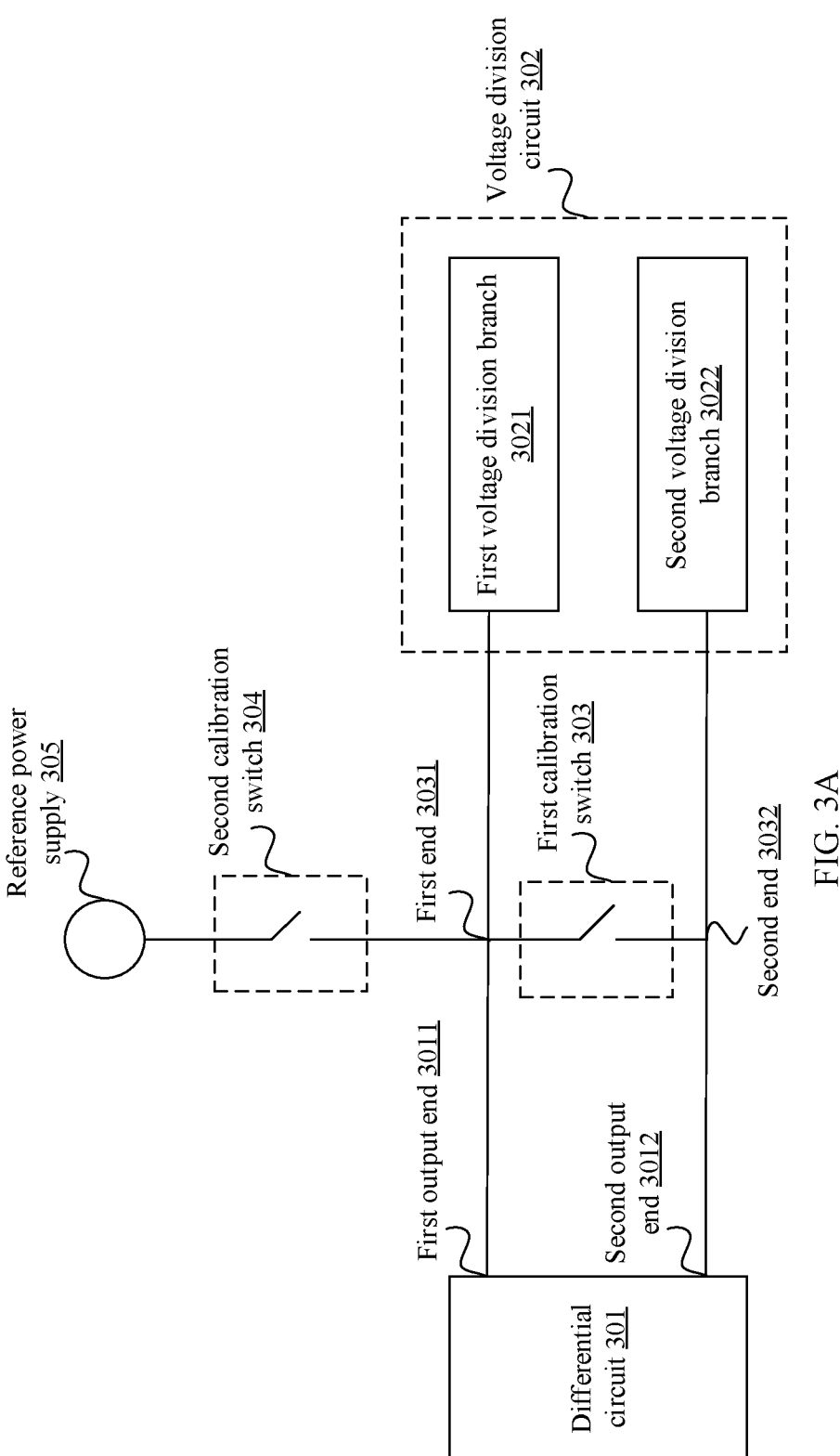
FIG. 3A is a schematic diagram of another voltage sampling apparatus according to an embodiment of the present disclosure.

In a possible implementation, refer to FIG. 3A. FIG. 3A is a schematic diagram of another voltage sampling apparatus according to an embodiment of the present disclosure. The voltage sampling apparatus 30 in FIG. 2A may further include a second calibration switch 304. One end of the second calibration switch 304 is connected to the first end 3031 of the first calibration switch 303, and the other end is connected to a reference power supply 305. When both the i$^{th}$ first switch and the i$^{th}$ second switch are in an off state, and the first calibration switch 303 and the second calibration switch 304 are in an on state, the voltage division circuit 302 is further configured to: receive, by using the second voltage division branch 3022, a reference voltage signal output by the reference power supply 305, and perform voltage division according to $k_2$ to output a fifth voltage signal, where the fifth voltage signal is used to calibrate $k_2$. It should be noted that, according to the foregoing equation 2 and equation 3, it may be learned that, when an actual differential output signal $(U_{difference1}-U_{difference2})$ is calculated, a coefficient before $U_{difference1}-U_{difference2}$ affects a result. Therefore, to obtain a voltage sampling signal closer to an actual output, as shown in FIG. 3A, the second calibration switch 304 is added based on the voltage sampling apparatus 30 in FIG. 2A, and is externally connected to the reference power supply 305 and configured to calibrate a voltage division ratio of each voltage division branch in the voltage division circuit. Specifically, when the first calibration switch 303 and the second calibration switch 304 are in an on state, the second voltage division branch 3022 in the voltage division circuit 302 can receive the voltage signal output by the reference power supply 305, and then the second voltage division branch 3022 performs voltage division on the voltage signal and outputs the fifth voltage signal. The reference power supply 305 can output a stable and known voltage signal. Therefore, the voltage division ratio ($k_2$) of the second voltage division branch 3022 may be obtained based on a value of the fifth voltage signal that is output by the second voltage division branch 3022 after voltage division and a value of the voltage signal of the reference power supply 305, to calibrate the voltage division ratio of the second voltage division branch 3022.

In a possible implementation, the calibration module is specifically configured to: when the target signal is the first differential output signal, restore, according to the calibrated $k_2$, the second sampling signal as the sampling value of the difference between the first differential output signal and the second differential output signal. Specifically, the second sampling signal is restored, according to the calibrated second voltage division ratio, as the sampling value of the difference between the two voltage signals actually output by the differential circuit. This avoids a sampling error caused to sampling by the voltage division ratio, and further improves sampling precision of the voltage sampling apparatus.

In a possible implementation, when the $i^{th}$ first switch, the $i^{th}$ second switch, and the first calibration switch 303 are all in an off state, and the second calibration switch 304 is in an on state, the voltage division circuit 302 in FIG. 3A is further configured to: receive, by using the first voltage division branch 3021, the reference voltage signal output by the reference power supply 305, and perform voltage division according to $k_1$ to output a sixth voltage signal, where the sixth voltage signal is used to calibrate $k_1$. Specifically, when the first calibration switch 303 is in an off state and the second calibration switch 304 is in an on state, the first voltage division branch 3021 in the voltage division circuit 302 can receive the voltage signal output by the reference power supply 305, and then the first voltage division branch 3021 performs voltage division on the voltage signal and outputs the sixth voltage signal. The reference power supply 305 can output a stable and known voltage signal. Therefore, the voltage division ratio ($k_1$) of the first voltage division branch 3021 may be obtained based on a value of the sixth voltage signal that is output by the first voltage division branch 3021 after voltage division and the value of the voltage signal of the reference power supply 305, to calibrate the voltage division ratio of the first voltage division branch 3021.

In a possible implementation, the calibration module is specifically configured to: when the target signal is the second differential output signal, restore, according to the calibrated $k_1$, the second sampling signal as the sampling value of the difference between the first differential output signal and the second differential output signal. Specifically, the second sampling signal is restored, according to the calibrated first voltage division ratio, as the sampling value of the difference between the two voltage signals actually output by the differential circuit. This avoids a sampling error caused to sampling by the voltage division ratio, and further improves sampling precision of the voltage sampling apparatus.

Figures 1, 3B:
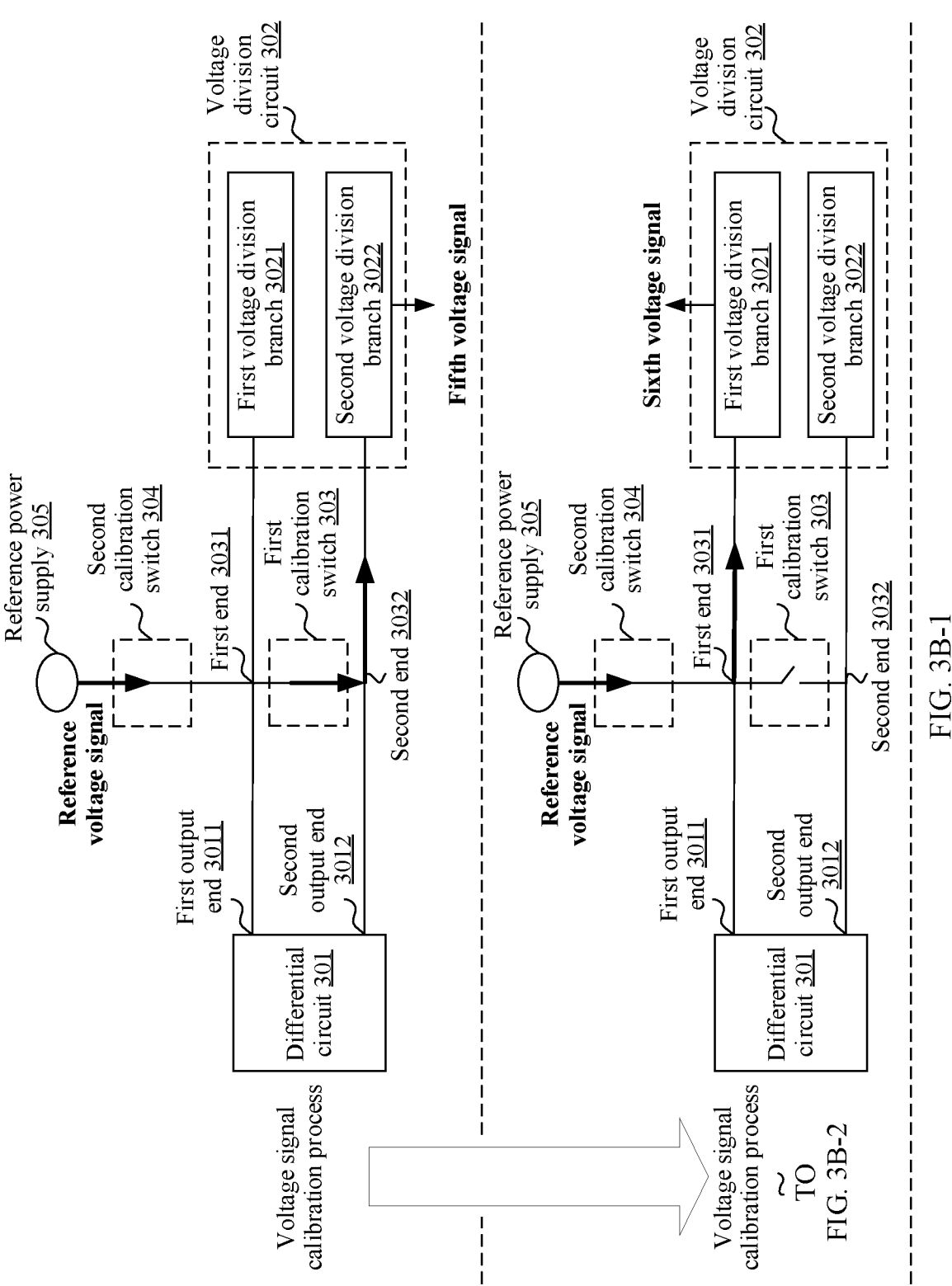
FIG. 3B-1 and FIG. 3B-2 show a schematic diagram of a voltage sampling process based on another voltage sampling apparatus according to an embodiment of the present disclosure.
Figures 2, 3B:
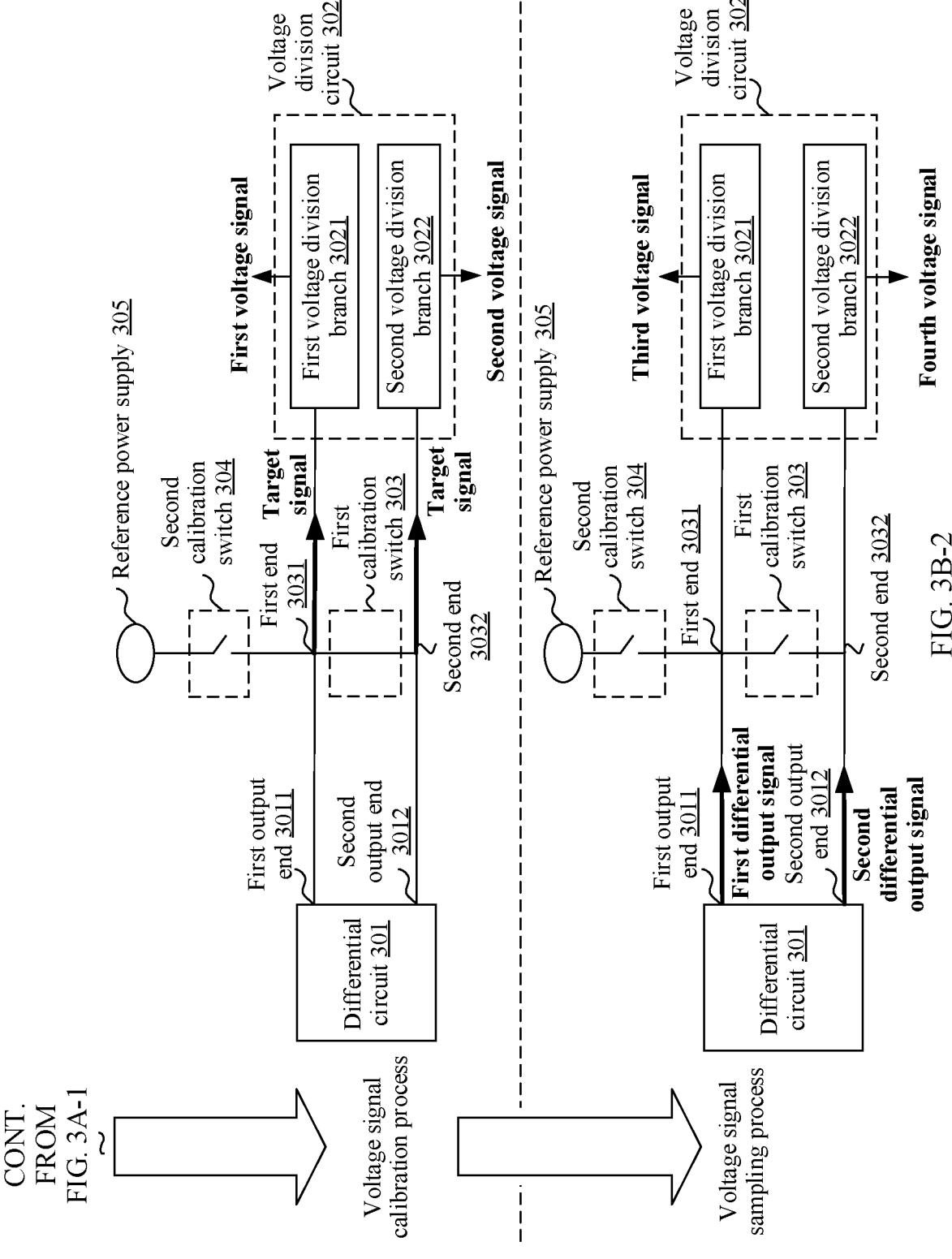

For example, as shown in FIG. 3B-1 and FIG. 3B-2, FIG. 3B-1 and FIG. 3B-2 show a schematic diagram of a voltage sampling process based on another voltage sampling apparatus according to an embodiment of the present disclosure. In the figure, according to the voltage sampling apparatus 30 in FIG. 3A, in a voltage signal calibration stage, the first calibration switch 303 and the second calibration switch 304 may be first switched on. The second voltage division branch 3022 receives the reference voltage signal output by the reference power supply 305, and performs voltage division to output the fifth voltage signal. The voltage division ratio $k_2$ of the second voltage division branch 3022 can be obtained through calculation based on the value of the fifth voltage signal and the value of the reference voltage signal. Further, the first calibration switch 303 may be switched off. The first voltage division branch 3021 receives the reference voltage signal output by the reference power supply 305, and performs voltage division to output the sixth voltage signal. The voltage division ratio $k_1$ of the first voltage division branch 3011 can be obtained through calculation based on the value of the sixth voltage signal and the value of the reference voltage signal. Then, the second calibration switch 304 is switched off, and the first calibration switch 303 is switched on. The first voltage division branch 3021 and the second voltage division branch 3022 separately receive the target signal output by the differential circuit 301, and perform voltage division to separately output the first voltage signal and the second voltage signal and obtain the first deviation signal, that is, $U_{difference1}(k_1-k_2)$ or $U_{difference2}(k_1-k_2)$, based on the first voltage signal and the second voltage signal, to complete voltage signal calibration. In a voltage signal sampling stage, the first calibration switch 303 is switched off. The first voltage division branch 3021 receives the first differential output signal, and performs voltage division to output the third voltage signal. The second voltage division branch 3022 receives the second differential output signal, and performs voltage division to output the fourth voltage signal. A differential sampling signal is obtained based on the third voltage signal and the fourth voltage signal, that is, $U_{sampling}=k_1 \times U_{difference1}-k_2 \times U_{difference2}$. Further, the difference ($U_{difference1}-U_{difference2}$) of the voltage signals actually output by the differential circuit 301 can be more accurately calculated according to the foregoing equation 2 or equation 3.

Figure 3C:
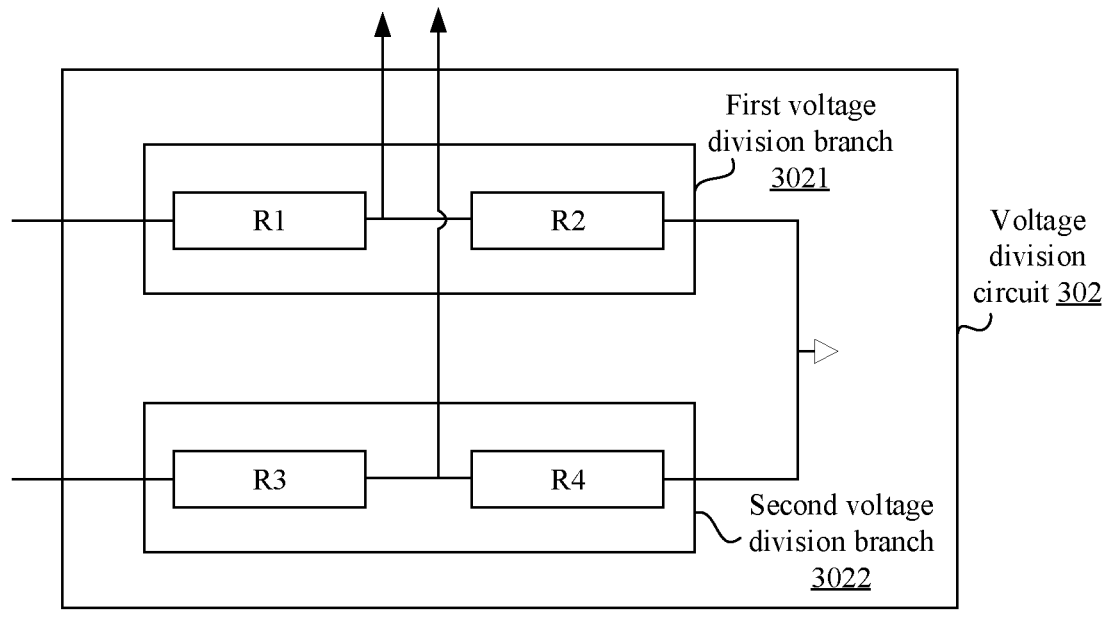
FIG. 3C is a schematic diagram of a voltage division circuit according to an embodiment of the present disclosure.

In a possible implementation, as shown in FIG. 2A or FIG. 3A, a ground end of the first voltage division branch 3021 and a ground end of the second voltage division branch 3022 are both connected to a ground cable. The first voltage division branch 3021 includes M series-connected first voltage division resistors, the second voltage division branch 3022 includes M series-connected second voltage division resistors, and M is an integer greater than 1. When the first calibration switch 303 is in an on state, the voltage division circuit 302 is specifically configured to: perform, by using the M series-connected first voltage division resistors, voltage division on the target signal according to $k_1$ to output the first voltage signal, and perform, by using the M series-connected second voltage division resistors, voltage division on the target signal according to $k_2$ to output the second voltage signal. Specifically, the ground ends of the two voltage division branches in the voltage division circuit 302 are connected to the ground cable, and a voltage division element may be a plurality of series-connected resistors, to implement voltage division on an input voltage signal, to output a voltage signal that meets a voltage withstand limitation condition of the sampling chip. For example, as shown in FIG. 3C, FIG. 3C is a schematic diagram of a voltage division circuit according to an embodiment of the present disclosure. In the figure, a voltage division element in the first voltage division branch 3021 is two series-connected resistors, that is, R1 and R2. A voltage division element in the second voltage division branch 3022 is two series-connected resistors, that is, R3 and R4. When the first calibration switch 303 is in an on state, the first voltage division branch 3021 performs voltage division on the target signal by using R1 to output the first voltage signal, and the second voltage division branch 3022 performs voltage division on the target signal by using R3 to output the second voltage signal.

In a possible implementation, as shown in FIG. 2A or FIG. 3A, when the first calibration switch 303 is in an off state, the voltage division circuit 302 is specifically configured to: perform, by using the M series-connected first voltage division resistors, voltage division on the first differential output signal according to $k_1$ to output the third voltage signal, and perform, by using the M series-connected second voltage division resistors, voltage division on the second differential output signal according to $k_2$ to output the fourth voltage signal. Specifically, when the first calibration switch 303 is in an off state, the first voltage division branch 3021 receives the first differential output signal, and performs voltage division on the signal by using the voltage division resistors, to output the voltage signal obtained through voltage division. The second voltage division branch 3022 receives the second differential output signal, and performs voltage division on the signal by using the voltage division resistors, to output the voltage signal obtained through voltage division.

Figure 3D:
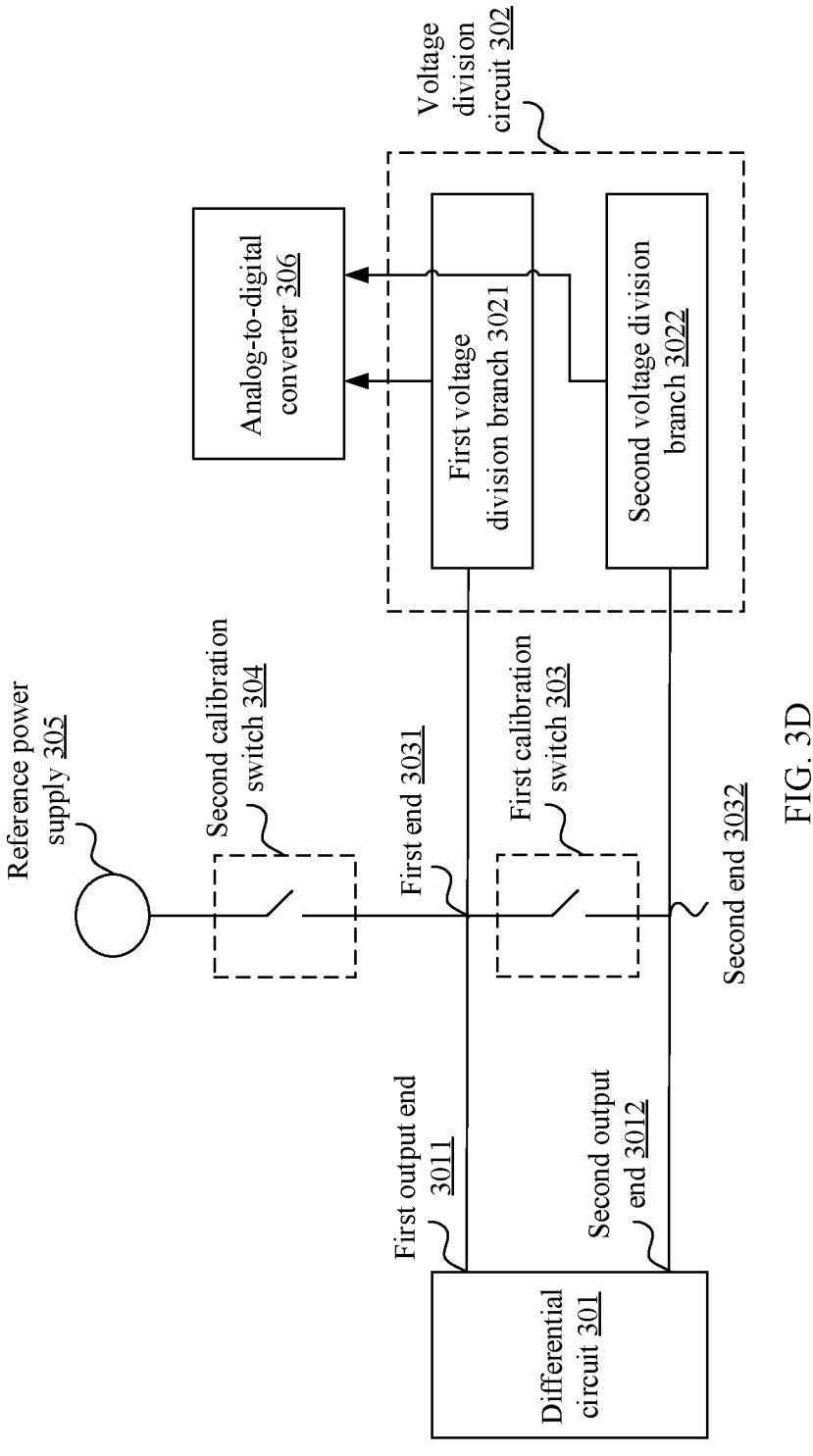
FIG. 3D is a schematic diagram of still another voltage sampling apparatus according to an embodiment of the present disclosure.

In a possible implementation, refer to FIG. 3D. FIG. 3D is a schematic diagram of still another voltage sampling apparatus according to an embodiment of the present disclosure. The voltage sampling apparatus 30 in FIG. 3A may further include an analog-to-digital converter 306. The analog-to-digital converter 306 is configured to: receive an output signal of the voltage division circuit 302, and convert the output signal from an analog signal into a digital signal, where the output signal includes the first voltage signal and the second voltage signal, or the third voltage signal and the fourth voltage signal, or the fifth voltage signal, or the sixth voltage signal. Specifically, as shown in FIG. 3D, the analog-to-digital converter 306 is added based on the voltage sampling circuit in FIG. 3A, and is configured to convert an analog signal output by the voltage division circuit 302 into a digital signal, to facilitate subsequent digital operation.

In this embodiment of the present disclosure, a differential sampling apparatus in a conventional technology is optimized to calibrate the voltage sampling signal. This improves sampling precision of the voltage sampling signal.

Figure 4A:
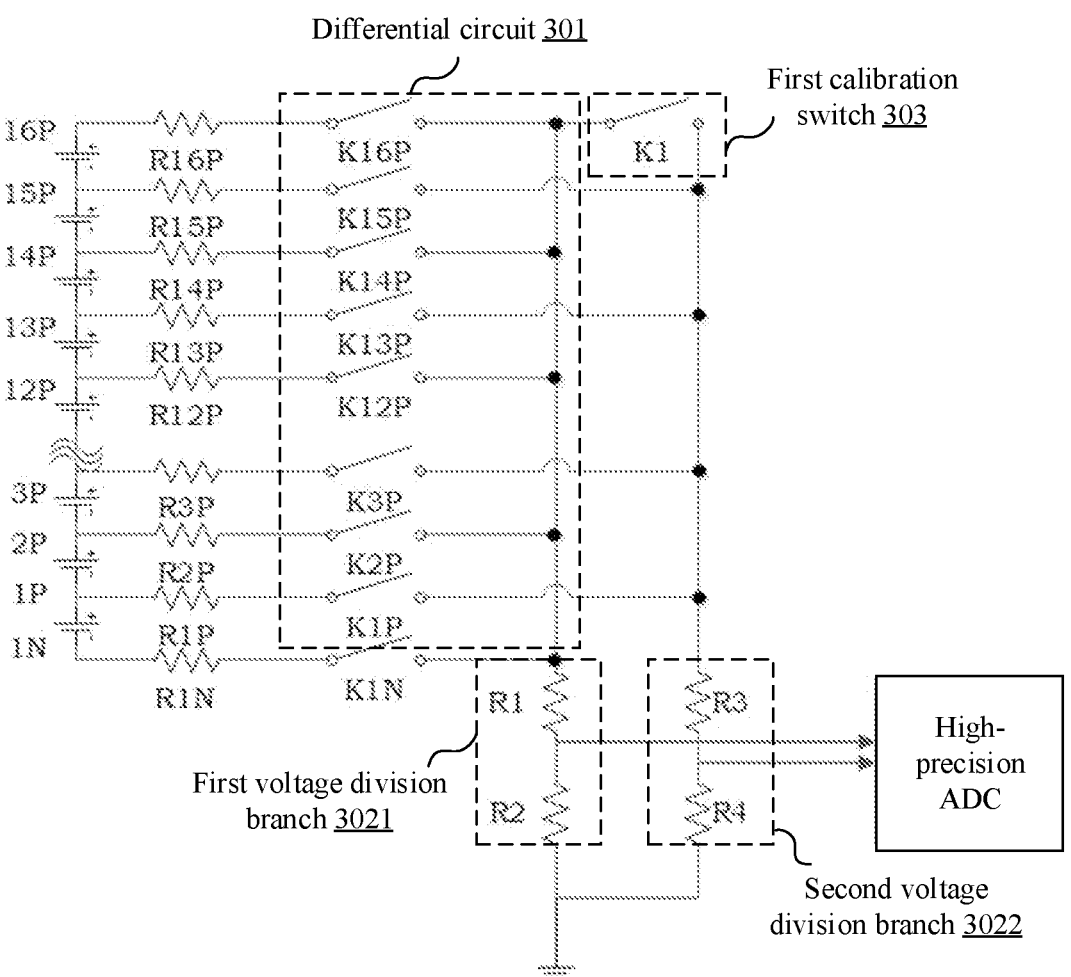
FIG. 4A is a schematic diagram of a voltage sampling apparatus in which 16 cells are used as an example according to an embodiment of the present disclosure.

To describe in more detail the voltage sampling apparatus in this embodiment of this application, the following provides an example description with reference to FIG. 4A. FIG. 4A is a schematic diagram of a voltage sampling apparatus in which 16 cells are used as an example according to an embodiment of the present disclosure. It should be noted that in FIG. 4A, that the N series-connected cells connected to the differential circuit 301 in the voltage sampling apparatus 30 are 16 cells is used as an example, and each cell may be connected to the switch through a protective resistor. In FIG. 2A, a voltage division element in the first voltage division branch 3021 is two series-connected resistors, that is, R1 and R2. A voltage division element in the second voltage division branch 3022 is two series-connected resistors, that is, R3 and R4. $U_{16P}$ is the voltage signal of the first cell in FIG. 2D, $U_{15P}$ is the voltage signal of the second cell, and $U_{14P}$ is a voltage signal of a third cell. By analogy, $U_{1P}$ is a voltage signal of a sixteenth cell. K16P is the $1^{st}$ first switch in FIG. 2D, K15P is the $1^{st}$ second switch, and K14P is a $2^{nd}$ first switch. By analogy, K1P is an $8^{th}$ second switch. K1 is the first calibration switch 303 in FIG. 2A.

Figure 4B:
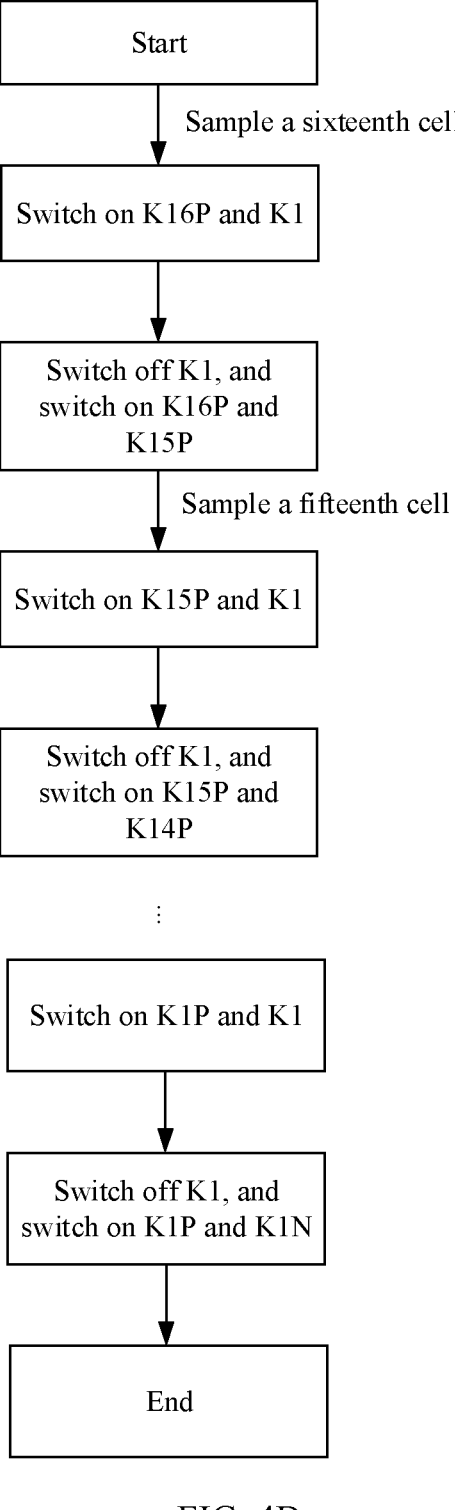
FIG. 4B is a flowchart of a sampling process in which 16 cells are used as an example according to an embodiment of the present disclosure.
Figure 4C:
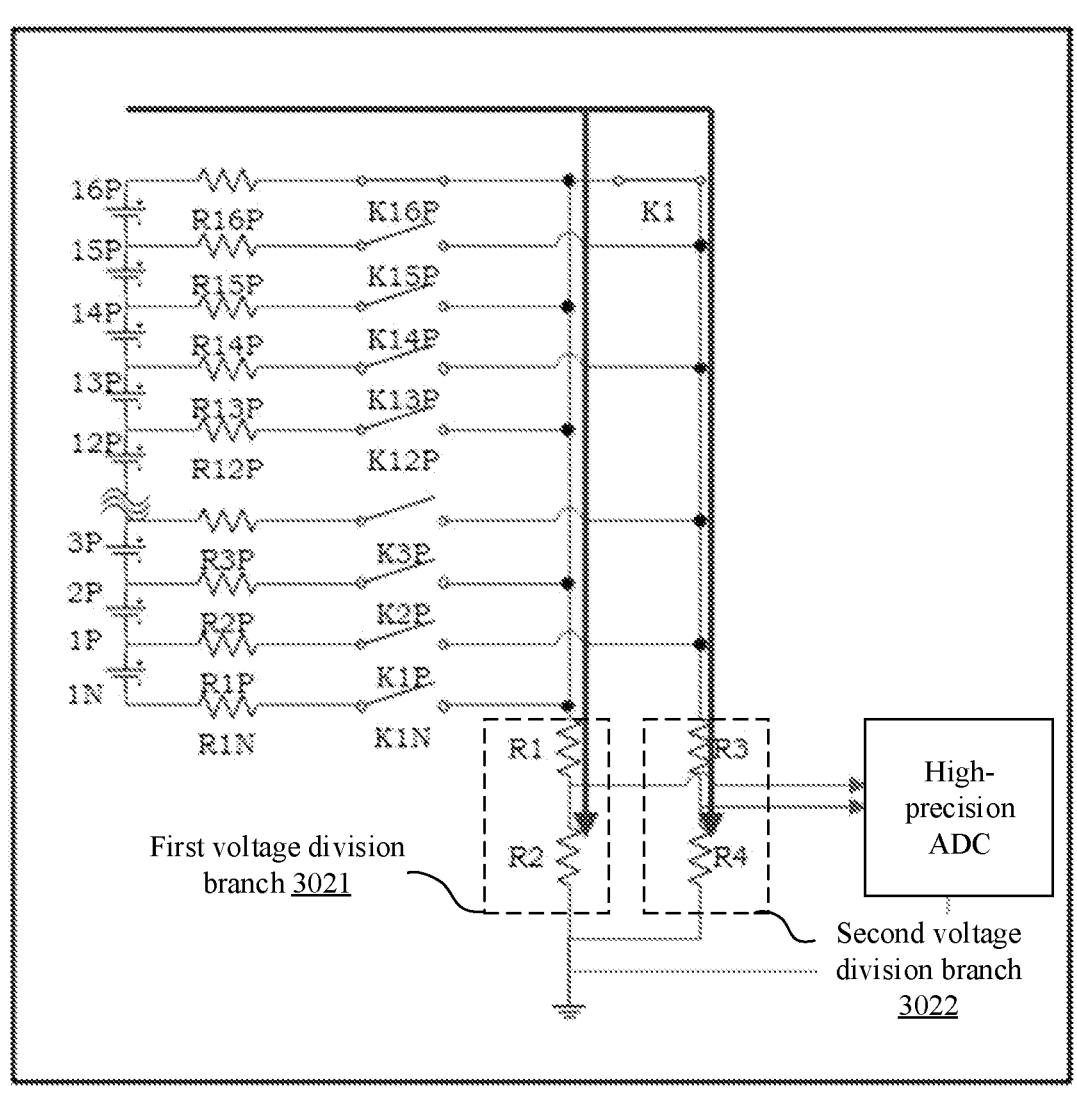
FIG. 4C(a) to FIG. 4C(d) show a detailed schematic flowchart of sampling voltage signals of 16 cells according to an embodiment of the present disclosure.
Figure 4C:
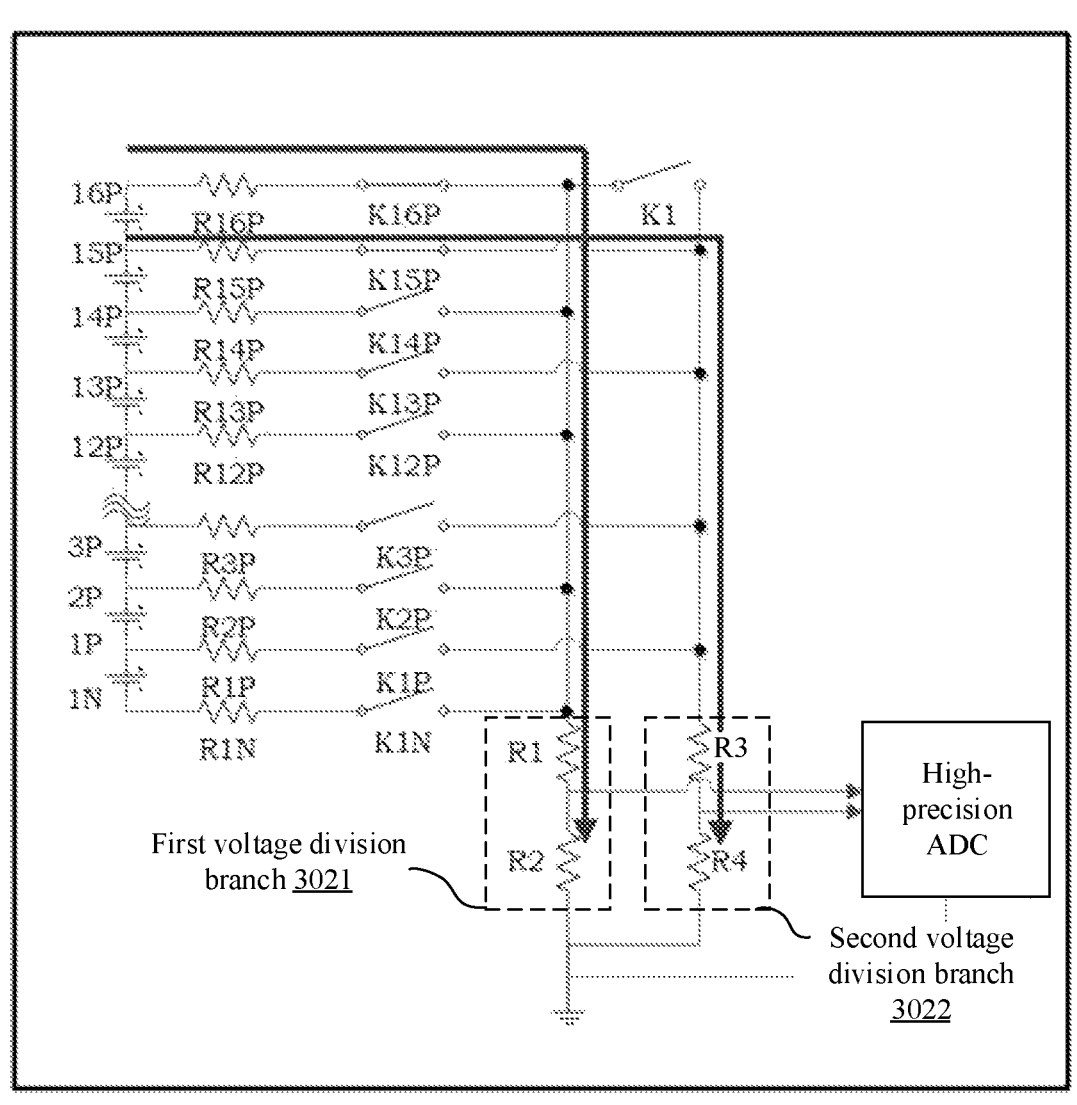
Figure 4C:
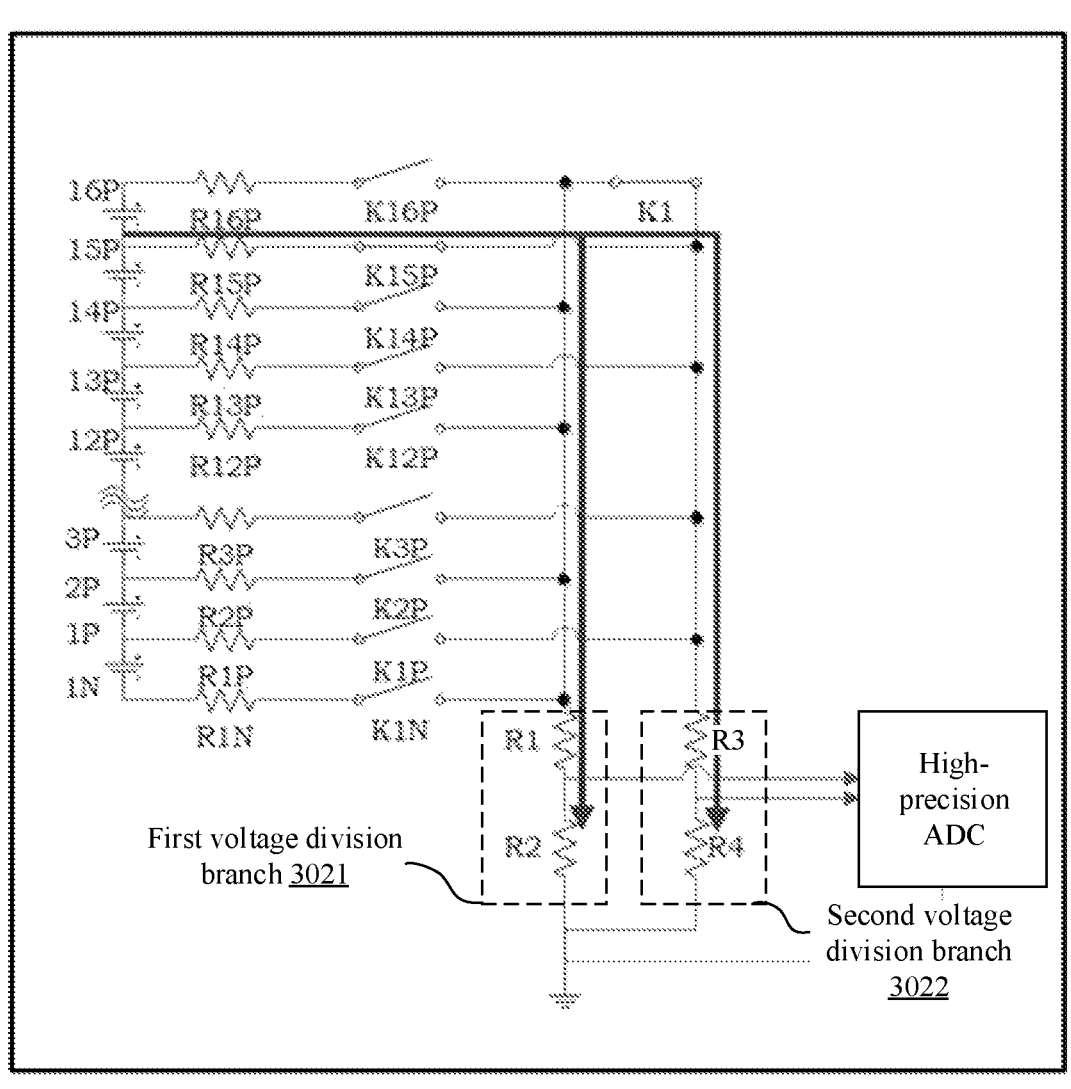
Figure 4C:
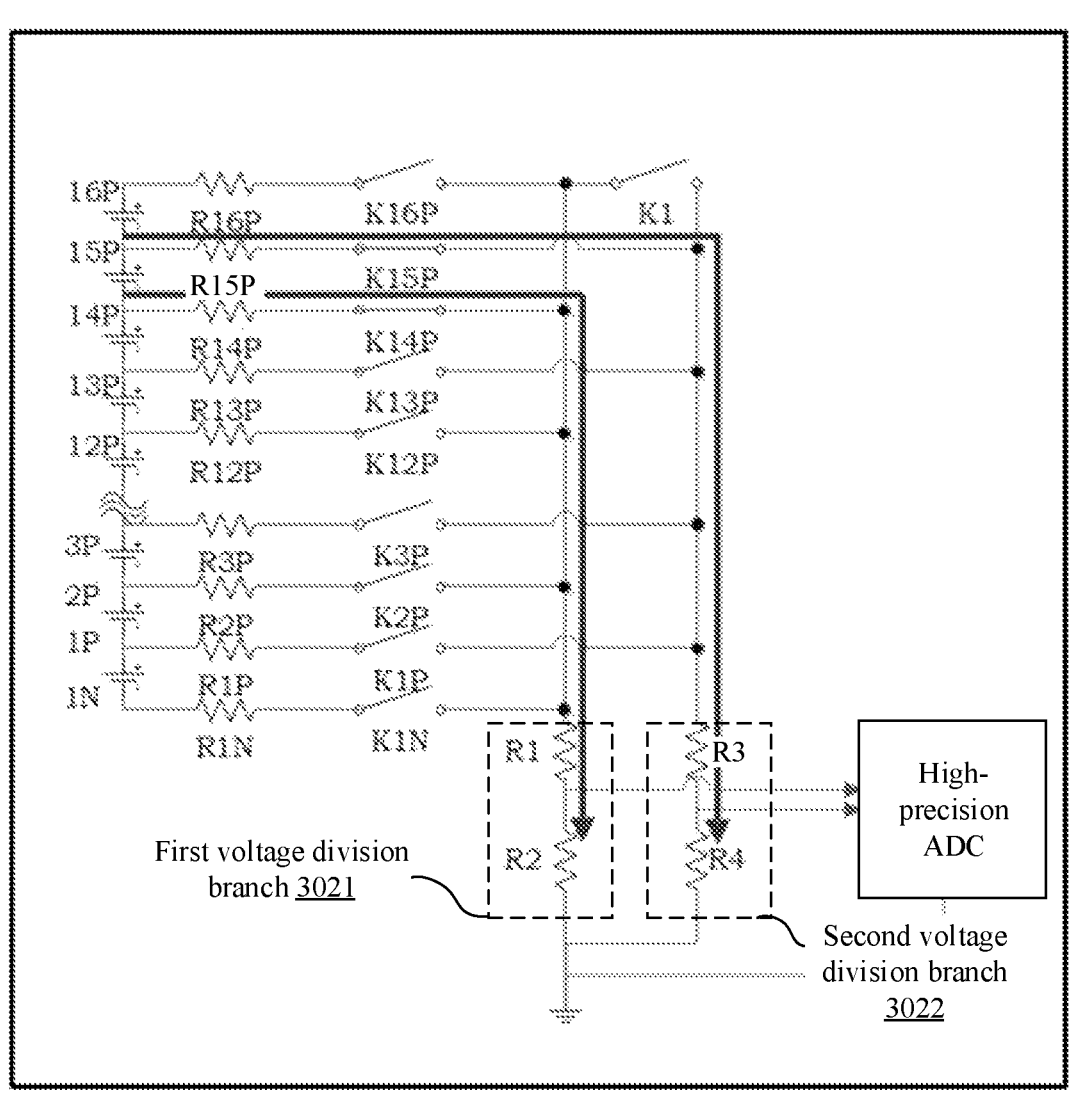

Refer to FIG. 4B. FIG. 4B is a flowchart of a sampling process in which 16 cells are used as an example according to an embodiment of the present disclosure. In the figure, the sixteenth cell (the first cell in FIG. 2D) is first sampled, and K16P and K1 are switched on, to obtain a first deviation signal, that is, $U_{16P}(k_1-k_2)$. As shown in FIG. 4C(a) to FIG. 4C(d), FIG. 4C(a) to FIG. 4C(d) show a detailed schematic flowchart of sampling voltage signals of 16 cells according to an embodiment of the present disclosure. As shown in FIG. 4C(a), K16P and K1 in FIG. 4A are switched on, and then $U_{16P}$ enters the first voltage division branch 3021 and the second voltage division branch 3022 for voltage division, to obtain $U_{16P}(k_1-k_2)$. Further, K1 is switched off, and K16P and K15P are switched on, to obtain a differential sampling signal $U_{sampling16}$. As shown in FIG. 4C(b), when K1 is switched off, and K16P and K15P are switched on, the first voltage division branch 3021 receives $U_{16P}$ and performs voltage division, and the second voltage division branch 3022 receives $U_{15P}$ and performs voltage division, to obtain the differential sampling signal $U_{sampling16}$. Then, an output signal of the sixteenth cell is reversely calculated, as shown in the following equation 4:

$$U_{sampling16}-U_{16P}(k_1-k_2)=k_2(U_{16P}-U_{15P}) \qquad \text{(equation 4)}$$

According to the equation 4, a more actual differential output signal ($U_{16P}-U_{15P}$)) of the sixteenth cell can be reversely calculated. It should be noted that the equation 4 is changed from the foregoing equation 2.

Further, sampling is performed on a fifteenth cell (the second cell in FIG. 2D), K16P and K15P are switched off, and then K15P and K1 are switched on, to obtain a first deviation signal, that is, $U_{15P}(k_1-k_2)$. As shown in FIG. 4C(c), when K15P and K1 are switched on, $U_{15P}$ enters the first voltage division branch 3021 and the second voltage division branch 3022 for voltage division, to obtain $U_{15P}$ ($k_1-k_2$). Then, K1 is switched off, and K15P and K14P are switched on, to obtain a differential sampling signal $U_{sampling15}$. As shown in FIG. 4C(d), when K1 is switched off, and K15P and K14P are switched on, the first voltage division branch 3021 receives $U_{14P}$ and performs voltage division, and the second voltage division branch 3022 receives $U_{15P}$ and performs voltage division, to obtain the differential sampling signal $U_{sampling15}$. Then, an output signal of the fifteenth cell is reversely calculated, as shown in the following equation 5:

$$U_{sampling15}-U_{15P}(k_1-k_2)=k_1(U_{15P}-U_{14P}) \qquad \text{(equation 5)}$$

According to the equation 5, a more actual differential output signal ($U_{15P}-U_{14P}$) of the fifteenth cell can be reversely calculated. Similarly, the equation 5 is changed from the foregoing equation 3. By analogy, voltage signals of the 16 cells can be collected in sequence. Details are not described herein again.

Figure 4D:
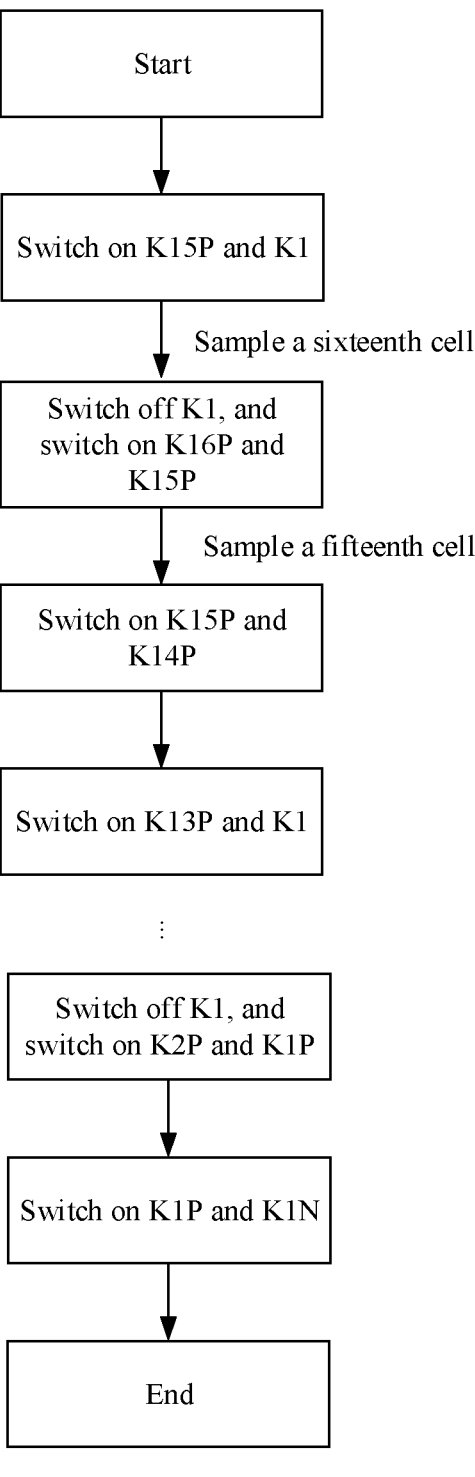
FIG. 4D is a flowchart of another sampling process in which 16 cells are used as an example according to an embodiment of the present disclosure.

Refer to FIG. 4D. FIG. 4D is a flowchart of another sampling process in which 16 cells are used as an example according to an embodiment of the present disclosure. In the figure, K15P and K1 in FIG. 4A are first switched on, to obtain a first deviation signal, that is, $U_{15P}(k_1-k_2)$. Further, K1 is switched off, and K16P and K15P are switched on, to obtain a differential sampling signal $U_{sampling16}$. Then, an output signal of the sixteenth cell is reversely calculated, as shown in the following equation 6:

$$U_{sampling16}-U_{15P}(k_1-k_2)=k_1(U_{16P}-U_{15P}) \qquad \text{(equation 6)}$$

According to the equation 6, a more actual differential output signal ($U_{16P}-U_{15P}$)) of the sixteenth cell can be reversely calculated. It should be noted that the equation 6 is changed from the foregoing equation 3.

Further, K16P and K15P are switched off, and then K15P and K14P are switched on, to obtain a differential sampling signal $U_{sampling15}$. Then, when an output signal of the fifteenth cell is reversely calculated, a more actual differential output signal ($U_{15P}-U_{14P}$) of the fifteenth cell can be reversely calculated according to the equation 5. By analogy, voltage signals of the 16 cells can be collected in sequence. Details are not described herein again.

In the sampling procedure provided in FIG. 4B, calibration needs to be performed once before sampling is performed on each cell. In comparison, in the sampling procedure provided in FIG. 4D, calibration may be performed once before sampling is performed on every two cells. In other words, an odd-numbered cell and an even-numbered cell share a calibration result. This can improve a sampling speed.

Figure 5A:
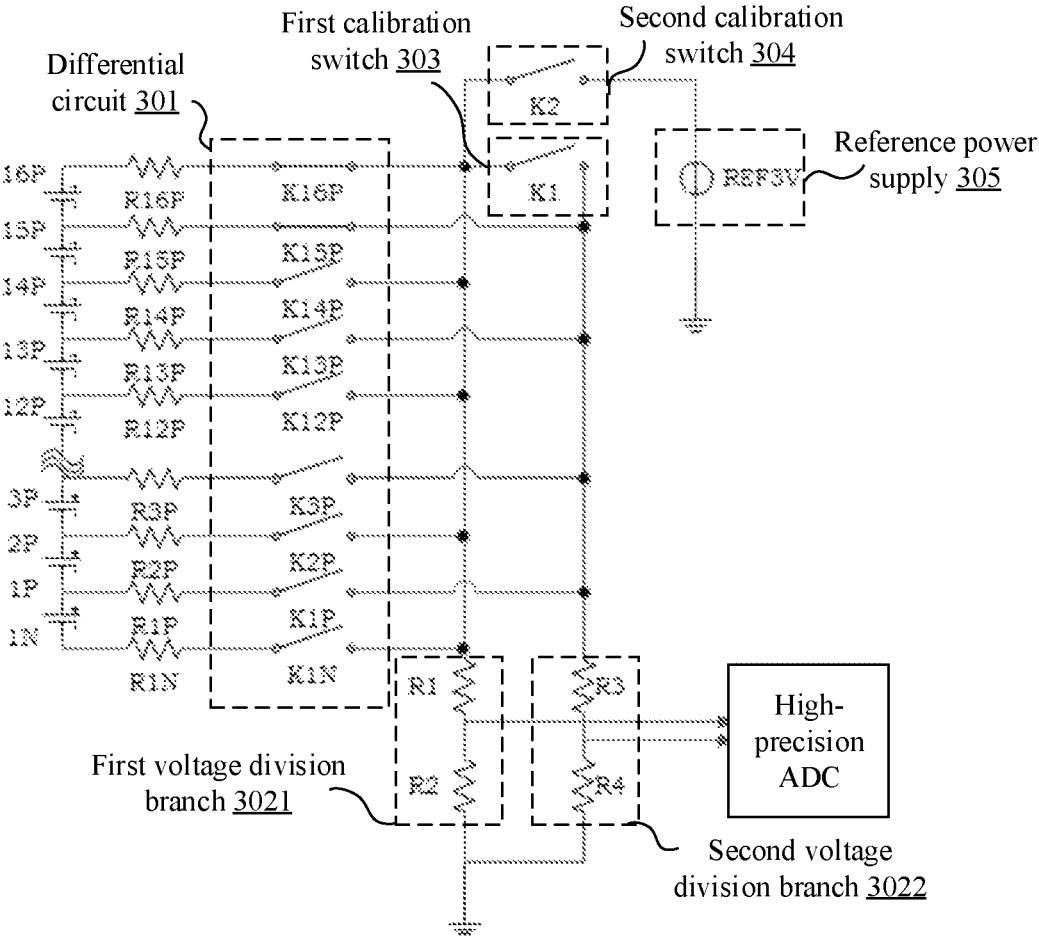
FIG. 5A is a schematic diagram of another voltage sampling apparatus in which 16 cells are used as an example according to an embodiment of the present disclosure.

The following provides an example description with reference to FIG. 5A. FIG. 5A is a schematic diagram of another voltage sampling apparatus in which 16 cells are used as an example according to an embodiment of the present disclosure. It should be noted that in FIG. 5A, that the N series-connected cells connected to the differential circuit 301 in the voltage sampling apparatus 30 are 16 cells is used as an example. In FIG. 3A, a voltage division element in the first voltage division branch 3021 is two series-connected resistors, that is, R1 and R2. A voltage division element in the second voltage division branch 3022 is two series-connected resistors, that is, R3 and R4. $U_{16P}$ is the voltage signal of the first cell in FIG. 2D, $U_{15P}$ is the voltage signal of the second cell, and $U_{14P}$ is a voltage signal of a third cell. By analogy, $U_{15P}$ is a voltage signal of a sixteenth cell. K16P is the $1^{st}$ first switch in FIG. 2D, K15P is the $1^{st}$ second switch, and K14P is a $2^{nd}$ first switch. By analogy, KIP is an $8^{th}$ second switch. K1 is the first calibration switch 303 in FIG. 3A. K2 is the second calibration switch 304 in FIG. 3A.

Figure 5B:
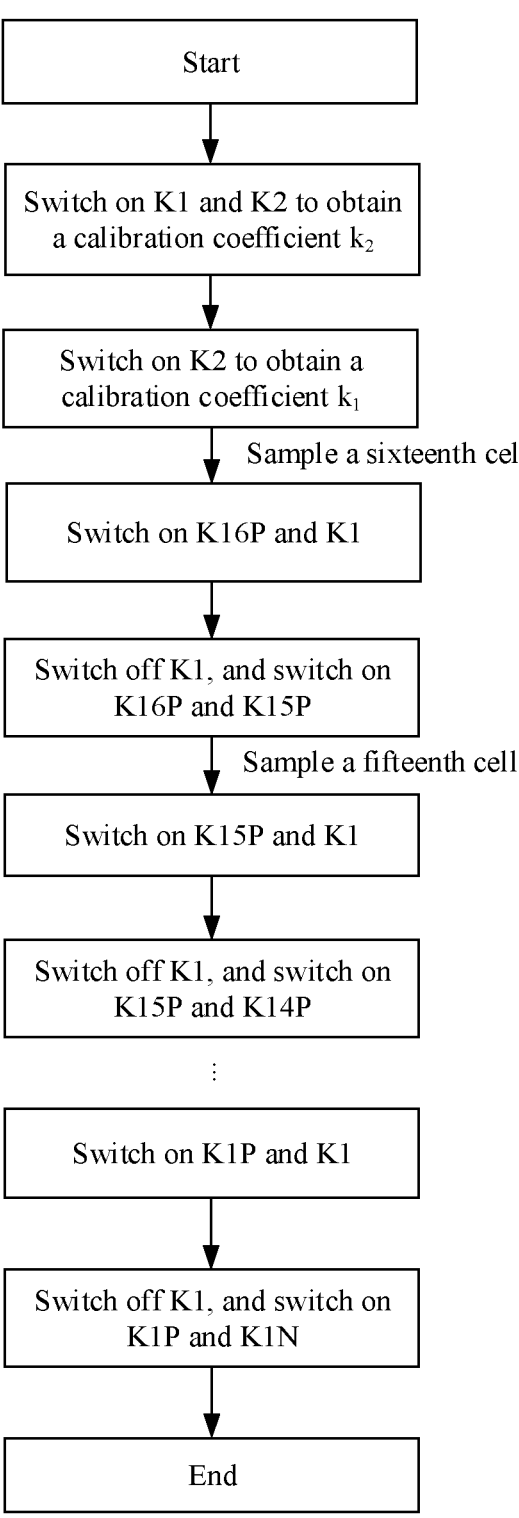
FIG. 5B is a flowchart of still another sampling process in which 16 cells are used as an example according to an embodiment of the present disclosure.
Figure 5C:
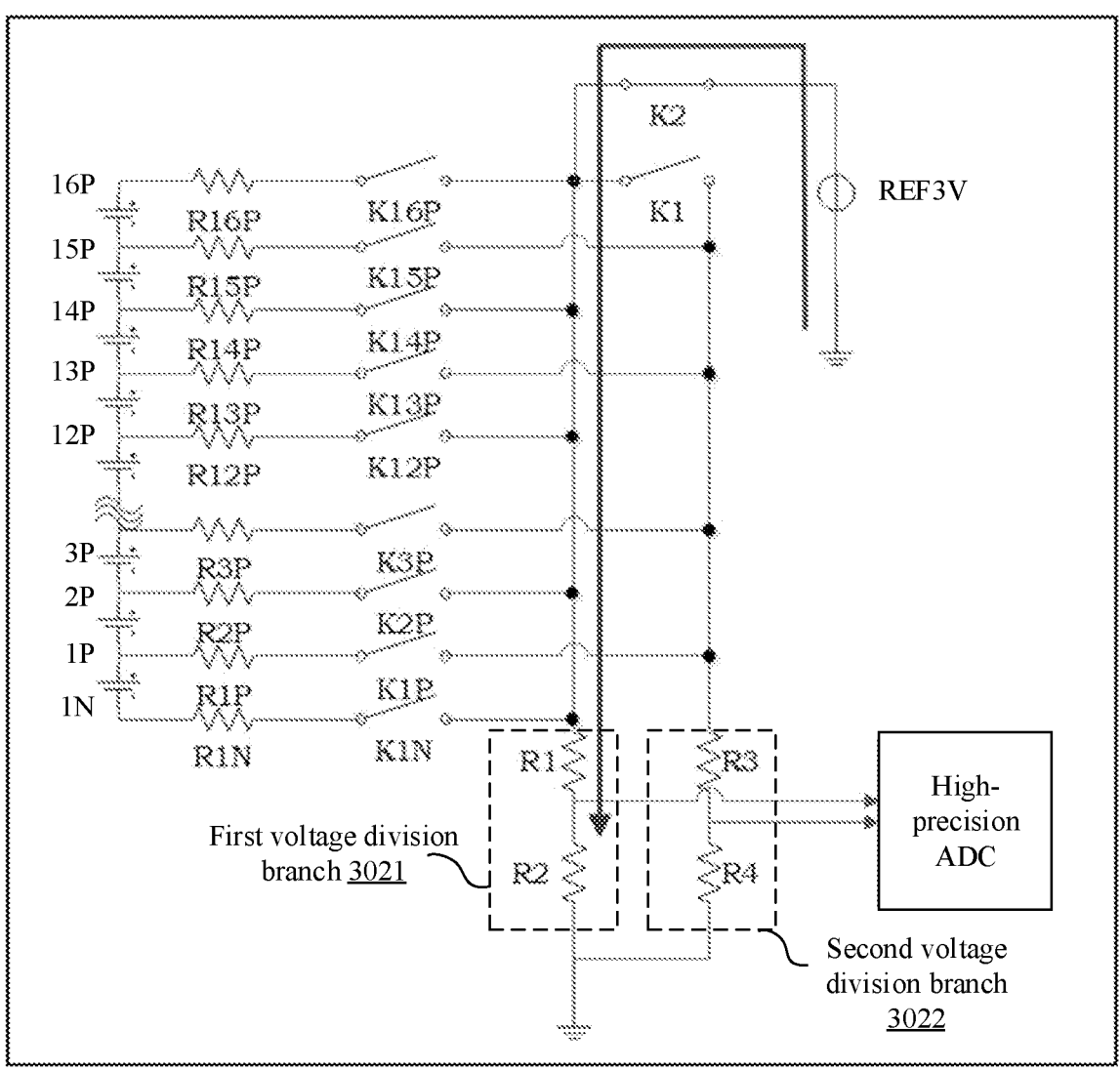
FIG. 5C(a) and FIG. 5C(b) show another detailed schematic flowchart of sampling voltage signals of 16 cells according to an embodiment of the present disclosure.
Figure 5C:
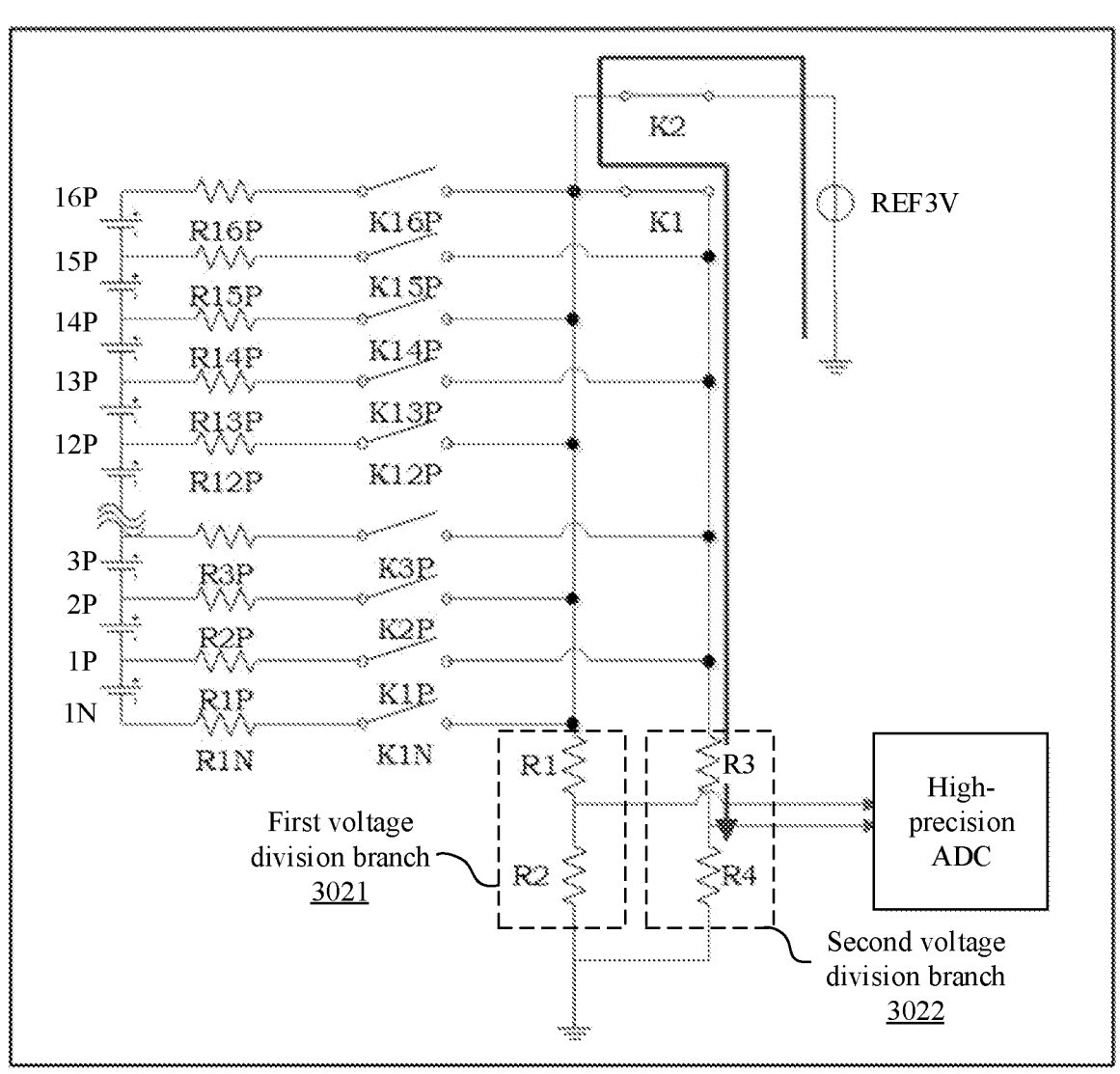

Refer to FIG. 5B. FIG. 5B is a flowchart of still another sampling process in which 16 cells are used as an example according to an embodiment of the present disclosure. Before the sampling process in FIG. 4B is performed, K1 and K2 may be first switched on, to obtain a calibrated voltage division ratio $k_2$ of the second voltage division branch. As shown in FIG. 5C(a) and FIG. 5C(b), FIG. 5C(a) and FIG. 5C(b) show another detailed schematic flowchart of sampling voltage signals of 16 cells according to an embodiment of the present disclosure. As shown in FIG. 5C(a), K1 and K2 in FIG. 5A are switched on, and then a voltage signal $U_{reference}$ output by a reference power supply enters the second voltage division branch 3022 for voltage division, to obtain $k_2$. Further, K1 is switched off, and K2 is switched on, to obtain a calibrated voltage division ratio $k_1$ of the first voltage division branch. As shown in FIG. 5C(b), K1 is switched off, and K2 is switched on. Then, the voltage signal $U_{reference}$ output by the reference power supply enters the first voltage division branch 3021 for voltage division, to obtain $k_1$. Then, the procedure shown in FIG. 4B is performed. Details are not described herein again. According to the apparatus provided in this embodiment of the present disclosure, voltage signal sampling precision can be further improved.

The voltage sampling apparatus in this embodiment of the present disclosure is described above in detail. A related method in embodiments of the present disclosure is provided below.

Refer to FIG. 6. FIG. 6 is a flowchart of a voltage sampling method according to an embodiment of the present disclosure. The method is applicable to any voltage sampling apparatus in FIG. 2A, FIG. 3A, and FIG. 3D and a device including the voltage sampling apparatus. The method may include the following steps S601 and S602. The voltage sampling apparatus includes a differential circuit, a voltage division circuit, and a first calibration switch. The voltage division circuit includes a first voltage division branch and a second voltage division branch. A first output end of the differential circuit and an input end of the first voltage division branch are connected to a first end of the first calibration switch. A second output end of the differential circuit and an input end of the second voltage division branch are connected to a second end of the first calibration switch.

Step S601: When the first calibration switch is in an on state, input, by using the differential circuit, a target signal to the first voltage division branch and the second voltage division branch that are connected in parallel.

Specifically, the target signal is a first differential output signal output by the first output end or a second differential output signal output by the second output end.

Step S602: Receive the target signal by using the first voltage division branch of the voltage division circuit and perform voltage division according to a first voltage division ratio $k_1$ to output a first voltage signal, and receive the target signal by using the second voltage division branch and perform voltage division according to a second voltage division ratio $k_2$ to output a second voltage signal.

Specifically, a difference between the first voltage signal and the second voltage signal is a first deviation signal, and the first deviation signal is used to calibrate a difference between the first voltage division ratio and the second voltage division ratio.

In a possible implementation, when the first calibration switch is in an off state, the first voltage division branch and the second voltage division branch are switched from a parallel-connected state to an open-circuit state. The method further includes: inputting the first differential output signal to the first voltage division branch through the first output end of the differential circuit, and inputting the second differential output signal to the second voltage division branch through the second output end; and receiving the first differential output signal by using the first voltage division branch of the voltage division circuit and performing voltage division according to $k_1$ to output a third voltage signal, and receiving the second differential output signal by using the second voltage division branch and performing voltage division according to $k_2$ to output a fourth voltage signal, where a difference between the third voltage signal and the fourth voltage signal is a first sampling signal.

In a possible implementation, the voltage sampling apparatus further includes a calibration module. The method further includes: obtaining, by using the calibration module, a second sampling signal through calculation based on the first deviation signal and the first sampling signal, where the second sampling signal indicates a difference between voltage signals obtained after voltage division is performed on the first differential output signal and the second differential output signal according to a same voltage division ratio, and the same voltage division ratio is the first voltage division ratio or the second voltage division ratio; and when the target signal is the first differential output signal, restoring, by using the calibration module according to $k_2$, the second sampling signal as a sampling value of a difference between the first differential output signal and the second differential output signal; or when the target signal is the second differential output signal, restoring, by using the calibration module according to $k_1$, the second sampling signal as a sampling value of a difference between the first differential output signal and the second differential output signal.

In a possible implementation, the obtaining, by using the calibration module, a second sampling signal through calculation based on the first deviation signal and the first sampling signal includes: calculating the second sampling signal according to an equation $U_{sampling1} - U_{difference1}(k_1 - k_2) - k_2(U_{difference1} - U_{difference2})$ or an equation $U_{sampling1} - U_{difference2}(k_1 - k_2) - k_1(U_{difference1} - U_{difference2})$, where $U_{sampling1}$ indicates the first sampling signal, $U_{difference1}$ indicates the first differential output signal, $U_{difference2}$ indicates the second differential output signal, $U_{difference1}(k_1-k_2)$ and $U_{difference2}(k_1-k_2)$ indicate the first deviation signal, and $k_2(U_{difference1}-U_{difference2})$ and $k_1(U_{difference1}-U_{difference2})$ indicate the second differential sampling signal.

In a possible implementation, the differential circuit includes a first switch group and a second switch group, where one end of an $i^{th}$ first switch in the first switch group is connected to a $(2i-1)^{th}$ cell in N series-connected cells, and the other end is connected to the first output end; one end of an $i^{th}$ second switch in the second switch group is connected to a $2i^{th}$ cell in the N series-connected cells, and the other end is connected to the second output end; and N is an integer greater than 1, and i=1, 2, . . . , or N.

In a possible implementation, the first calibration switch is in an on state. The inputting, by using the differential circuit, a target signal to the first voltage division branch and the second voltage division branch that are connected in parallel includes: when the $i^{th}$ first switch is in an on state and the $i^{th}$ second switch is in an off state, receiving, by using the differential circuit, a first differential input signal output by the $(2i-1)^{th}$ cell, and inputting, by using the $i^{th}$ first switch that is switched on, the first differential output signal to the first voltage division branch and the second voltage division branch that are connected in parallel; or when the $i^{th}$ first switch is in an off state and the $i^{th}$ second switch is in an on state, receiving, by using the differential circuit, a second differential input signal output by the $2i^{th}$ cell, and inputting, by using the $i^{th}$ second switch that is switched on, the second differential output signal to the first voltage division branch and the second voltage division branch that are connected in parallel.

In a possible implementation, the first calibration switch is in an off state. The inputting the first differential output signal to the first voltage division branch through the first output end of the differential circuit, and inputting the second differential output signal to the second voltage division branch through the second output end includes: when both the $i^{th}$ first switch and the $i^{th}$ second switch are in an on state, receiving, by using the differential circuit, a first differential input signal output by the $(2i-1)^{th}$ cell and inputting the first differential output signal to the first voltage division branch by using the $i^{th}$ first switch that is switched on, and receiving a second differential input signal output by the $2i^{th}$ cell and inputting the second differential output signal to the second voltage division branch by using the $i^{th}$ second switch that is switched on.

In a possible implementation, the voltage sampling apparatus further includes a second calibration switch. One end of the second calibration switch is connected to the first end of the first calibration switch, and the other end is connected to a reference power supply. When both the $i^{th}$ first switch and the $i^{th}$ second switch are in an off state, and the first calibration switch and the second calibration switch are in an on state, the method further includes: receiving, by using the second voltage division branch of the voltage division circuit, a reference voltage signal output by the reference power supply, and performing voltage division according to $k_2$ to output a fifth voltage signal, where the fifth voltage signal is used to calibrate $k_2$.

In a possible implementation, the restoring, according to $k_2$, the second sampling signal as a sampling value of a difference between the first differential output signal and the second differential output signal when the target signal is the first differential output signal includes: when the target signal is the first differential output signal, restoring, by using the calibration module according to the calibrated $k_2$, the second sampling signal as the sampling value of the difference between the first differential output signal and the second differential output signal.

In a possible implementation, when the $i^{th}$ first switch, the $i^{th}$ second switch, and the first calibration switch are all in an off state, and the second calibration switch is in an on state, the method further includes: receiving, by using the first voltage division branch of the voltage division circuit, the reference voltage signal output by the reference power supply, and performing voltage division according to $k_1$ to output a sixth voltage signal, where the sixth voltage signal is used to calibrate $k_1$.

In a possible implementation, the restoring, according to $k_1$, the second sampling signal as a sampling value of a difference between the first differential output signal and the second differential output signal when the target signal is the second differential output signal includes: when the target signal is the second differential output signal, restoring, by using the calibration module according to the calibrated $k_1$, the second sampling signal as the sampling value of the difference between the first differential output signal and the second differential output signal.

In a possible implementation, a ground end of the first voltage division branch and a ground end of the second voltage division branch are both connected to a ground cable. The first voltage division branch includes M series-connected first voltage division resistors, the second voltage division branch includes M series-connected second voltage division resistors, and M is an integer greater than 1. When the first calibration switch is in an on state, the receiving the target signal by using the first voltage division branch of the voltage division circuit and performing voltage division to output a first voltage signal, and receiving the target signal by using the second voltage division branch and performing voltage division to output a second voltage signal includes: performing, by using the M series-connected first voltage division resistors of the voltage division circuit, voltage division on the target signal according to $k_1$ to output the first voltage signal, and performing, by using the M series-connected second voltage division resistors, voltage division on the target signal according to $k_2$ to output the second voltage signal.

In a possible implementation, when the first calibration switch is in an off state, the receiving the first differential output signal by using the first voltage division branch of the voltage division circuit and performing voltage division to output a third voltage signal, and receiving the second differential output signal by using the second voltage division branch and performing voltage division to output a fourth voltage signal includes: performing, by using the M series-connected first voltage division resistors of the voltage division circuit, voltage division on the first differential output signal according to $k_1$ to output the third voltage signal, and performing, by using the M series-connected second voltage division resistors, voltage division on the second differential output signal according to $k_2$ to output the fourth voltage signal.

In a possible implementation, the voltage sampling apparatus further includes an analog-to-digital converter. The method further includes: receiving, by using the analog-to-digital converter, an output signal of the voltage division circuit, and converting the output signal from an analog signal into a digital signal, where the output signal includes the first voltage signal and the second voltage signal, or the third voltage signal and the fourth voltage signal, or the fifth voltage signal, or the sixth voltage signal.

It should be noted that the steps of the voltage sampling method described in this embodiment of the present disclosure are implemented in the voltage sampling apparatus in the foregoing embodiments. Details are not described herein again.

This application provides a terminal device. The terminal device has a function of implementing the method according to any one of the foregoing voltage sampling method embodiments. The function may be implemented by hardware, or may be implemented by hardware executing corresponding software. The hardware or the software includes one or more modules corresponding to the function.

This application provides a terminal device. The terminal device includes a processor. The processor is configured to support the terminal device in performing a corresponding function in the voltage sampling method provided above. The terminal device may further include a memory. The memory is coupled to the processor, and stores program instructions and data that are necessary for the terminal device. The terminal device may further include a communication interface, configured to implement communication between the terminal device and another device or a communication network.

An embodiment of the present disclosure provides a computer program. The computer program includes instructions. When the computer program is executed by a computer, the computer is enabled to perform a procedure in the voltage sampling method according to any one of the foregoing embodiments.

This application provides a chip system. The chip system includes a processor, configured to support an application server or a terminal device in implementing a function in the foregoing voltage sampling apparatus, for example, generating or processing information in the foregoing method. In a possible design, the chip system further includes a memory. The memory is configured to store program instructions and data that are necessary for a data sending device. The chip system may include a chip, or may include a chip and another discrete component.

This application provides a semiconductor chip. The semiconductor chip includes the voltage sampling apparatus according to any one of the foregoing embodiments.

This application provides an electronic device. The electronic device includes the foregoing semiconductor chip.

In the foregoing embodiments, the description of each embodiment has respective focuses. For a part that is not described in detail in an embodiment, reference may be made to related descriptions in other embodiments.

It should be noted that, for brief description, the foregoing method embodiments are represented as a series of actions. However, a person skilled in the art should appreciate that this application is not limited to the described order of the actions, because according to this application, some steps may be performed in another order or simultaneously. It should be further appreciated by a person skilled in the art that embodiments described in this specification all belong to example embodiments, and the involved actions and modules are not necessarily required by this application.

In the several embodiments provided in this application, it should be understood that the disclosed apparatus may be implemented in other manners. For example, the described apparatus embodiment is merely an example. For example, division into the units is merely logical function division and may be other division in actual implementation. For example, a plurality of units or components may be combined or integrated into another system, or some features may be ignored or not performed. In addition, the displayed or discussed mutual connections or direct connections or communication connections may be implemented by using some interfaces. The indirect connections or communication connections between the apparatuses or units may be implemented in electronic or other forms. For example, different modules in the apparatus may be indirectly connected by using a protection element, or may be directly connected between different modules.

The foregoing units described as separate parts may or may not be physically separate, and parts displayed as units may or may not be physical units, may be located in one position, or may be distributed on a plurality of network units. Some or all of the units may be selected based on actual requirements to achieve the objectives of the solutions of embodiments.

In addition, functional units in embodiments of this application may be integrated into one processing unit, or each of the units may exist alone physically, or two or more units are integrated into one unit. The integrated unit may be implemented in a form of hardware, or may be implemented in a form of a software functional unit.

When the foregoing integrated unit is implemented in the form of a software functional unit and sold or used as an independent product, the integrated unit may be stored in a computer-readable storage medium. Based on such an understanding, the technical solutions of this application essentially, or the part contributing to the prior art, or all or some of the technical solutions may be implemented in the form of a software product. The software product is stored in a storage medium and includes several instructions for instructing a computer device (which may be a personal computer, a server, or a network device) to perform all or some of the steps of the methods described in embodiments of this application. The foregoing storage medium includes any medium that can store program code, such as a USB flash drive, a removable hard disk, a magnetic disk, an optical disc, a read-only memory (Read-Only Memory, ROM for short), or a random access memory (Random Access Memory, RAM for short).

The foregoing embodiments are merely intended for describing the technical solutions of this application other than limiting this application. Although this application is described in detail with reference to the foregoing embodiments, a person of ordinary skill in the art should understand that they may still make modifications to the technical solutions described in the foregoing embodiments or make equivalent replacements to some technical features thereof, without departing from the spirit and scope of the technical solutions of embodiments of this application.

What is claimed is:

1. A voltage sampling apparatus, comprising:
   a differential circuit,
   a voltage division circuit,
   a first calibration switch,
   wherein the voltage division circuit comprises a first voltage division branch and a second voltage division branch, a first output end of the differential circuit and an input end of the first voltage division branch are connected to a first end of the first calibration switch, and a second output end of the differential circuit and an input end of the second voltage division branch are connected to a second end of the first calibration switch;
   wherein, when the first calibration switch is in an on state, the differential circuit is configured to input a target signal to the first voltage division branch and the second voltage division branch that are connected in parallel, wherein the target signal is a first differential output signal output by the first output end or a second differential output signal output by the second output end;

wherein when the first calibration switch is in an off state, the first voltage division branch and the second voltage division branch are switched from a parallel-connected state to an open-circuit state; and the voltage division circuit is configured to:

receive the target signal by using the first voltage division branch and perform voltage division according to a first voltage division ratio $k_1$ to output a first voltage signal, and receive the target signal by using the second voltage division branch and perform voltage division according to a second voltage division ratio $k_2$ to output a second voltage signal, wherein a difference between the first voltage signal and the second voltage signal is a first deviation signal, and the first deviation signal is used to calibrate a difference between the first voltage division ratio and the second voltage division ratio.

2. The apparatus according to claim 1, wherein the differential circuit is further configured to: input the first differential output signal to the first voltage division branch through the first output end, and input the second differential output signal to the second voltage division branch through the second output end; and the voltage division circuit is further configured to:

receive the first differential output signal by using the first voltage division branch and perform voltage division according to $k_1$ to output a third voltage signal, and receive the second differential output signal by using the second voltage division branch and perform voltage division according to $k_2$ to output a fourth voltage signal, wherein a difference between the third voltage signal and the fourth voltage signal is a first sampling signal.

3. The apparatus according to claim 2, wherein the voltage sampling apparatus further comprises a calibration module, and the calibration module is configured to:

obtain a second sampling signal through calculation based on the first deviation signal and the first sampling signal, wherein the second sampling signal indicates a difference between voltage signals obtained after voltage division is performed on the first differential output signal and the second differential output signal according to a same voltage division ratio, and the same voltage division ratio is the first voltage division ratio or the second voltage division ratio; and when the target signal is the first differential output signal, restore, according to $k_2$, the second sampling signal as a sampling value of a difference between the first differential output signal and the second differential output signal; or when the target signal is the second differential output signal, restore, according to $k_1$, the second sampling signal as a sampling value of a difference between the first differential output signal and the second differential output signal.

4. The apparatus according to claim 3, wherein the calibration module is specifically configured to:

calculate the second sampling signal according to an equation $U_{sampling1} - U_{difference1}(k_1 - k_2) = k_2(U_{difference1} - U_{difference2})$ or an equation $U_{sampling1} - U_{difference2}(k_1 - k_2) = k_1(U_{difference1} - U_{difference2})$, wherein $U_{sampling1}$ indicates the first sampling signal, $U_{difference1}$ indicates the first differential output signal, $U_{difference2}$ indicates the second differential output signal, $U_{difference1}(k_1 - k_2)$ and $U_{difference2}(k_1 - k_2)$ indicate the first deviation signal, and $k_2(U_{difference1} - U_{difference2})$ and $k_1(U_{difference1} - U_{difference2})$ indicate the second differential sampling signal.

5. The apparatus according to claim 2, wherein the differential circuit comprises a first switch group and a second switch group, wherein one end of an $i^{th}$ first switch in the first switch group is connected to a $(2i-1)^{th}$ cell in N series-connected cells, and the other end is connected to the first output end; one end of an $i^{th}$ second switch in the second switch group is connected to a $2i^{th}$ cell in the N series-connected cells, and the other end is connected to the second output end; and N is an integer greater than 1, and $i=1, 2, \ldots,$ or N.

6. The apparatus according to claim 5, wherein the first calibration switch is in an on state; and when the $i^{th}$ first switch is in an on state and the $i^{th}$ second switch is in an off state, the differential circuit is specifically configured to: receive a first differential input signal output by the $(2i-1)^{th}$ cell, and input, by using the $i^{th}$ first switch that is switched on, the first differential output signal to the first voltage division branch and the second voltage division branch that are connected in parallel; or when the $i^{th}$ first switch is in an off state and the $i^{th}$ second switch is in an on state, the differential circuit is specifically configured to: receive a second differential input signal output by the $2i^{th}$ cell, and input, by using the $i^{th}$ second switch that is switched on, the second differential output signal to the first voltage division branch and the second voltage division branch that are connected in parallel.

7. The apparatus according to claim 5, wherein the first calibration switch is in an off state; and when both the $i^{th}$ first switch and the $i^{th}$ second switch are in an on state, the differential circuit is specifically configured to: receive a first differential input signal output by the $(2i-1)^{th}$ cell and input the first differential output signal to the first voltage division branch by using the $i^{th}$ first switch that is switched on, and receive a second differential input signal output by the $2i^{th}$ cell and input the second differential output signal to the second voltage division branch by using the $i^{th}$ second switch that is switched on.

8. The apparatus according to claim 5, wherein the voltage sampling apparatus further comprises a second calibration switch; one end of the second calibration switch is connected to the first end of the first calibration switch, and the other end is connected to a reference power supply; and when both the $i^{th}$ first switch and the $i^{th}$ second switch are in an off state, and the first calibration switch and the second calibration switch are in an on state, the voltage division circuit is further configured to:

receive, by using the second voltage division branch, a reference voltage signal output by the reference power supply, and perform voltage division according to $k_2$ to output a fifth voltage signal, wherein the fifth voltage signal is used to calibrate $k_2$.

9. The apparatus according to claim 8, wherein a calibration module is specifically configured to:

when the target signal is the first differential output signal, restore, according to the calibrated $k_2$, the second sampling signal as the sampling value of the difference between the first differential output signal and the second differential output signal.

10. The apparatus according to claim 8, wherein when the $i^{th}$ first switch, the $i^{th}$ second switch, and the first calibration switch are all in an off state, and the second calibration switch is in an on state, the voltage division circuit is further configured to:

receive, by using the first voltage division branch, the reference voltage signal output by the reference power supply, and perform voltage division according to $k_1$ to output a sixth voltage signal, wherein the sixth voltage signal is used to calibrate $k_1$.

11. A voltage sampling method performed by a voltage sampling apparatus, that comprises a differential circuit, a voltage division circuit, and a first calibration switch, wherein the voltage division circuit comprises a first voltage division branch and a second voltage division branch, a first output end of the differential circuit and an input end of the first voltage division branch are connected to a first end of the first calibration switch, and a second output end of the differential circuit and an input end of the second voltage division branch are connected to a second end of the first calibration switch, the method comprising:

when the first calibration switch is in an on state, inputting, by using the differential circuit, a target signal to the first voltage division branch and the second voltage division branch that are connected in parallel, wherein the target signal is a first differential output signal output by the first output end or a second differential output signal output by the second output end;

wherein when the first calibration switch is in an off state, the first voltage division branch and the second voltage division branch are switched from a parallel-connected state to an open-circuit state; and receiving the target signal by using the first voltage division branch of the voltage division circuit and performing voltage division according to a first voltage division ratio $k_1$ to output a first voltage signal, and receiving the target signal by using the second voltage division branch and performing voltage division according to a second voltage division ratio $k_2$ to output a second voltage signal, wherein a difference between the first voltage signal and the second voltage signal is a first deviation signal, and the first deviation signal is used to calibrate a difference between the first voltage division ratio and the second voltage division ratio.

12. The method according to claim 11, wherein the method further comprises:

inputting the first differential output signal to the first voltage division branch through the first output end of the differential circuit, and inputting the second differential output signal to the second voltage division branch through the second output end; and receiving the first differential output signal by using the first voltage division branch of the voltage division circuit and performing voltage division according to $k_1$ to output a third voltage signal, and receiving the second differential output signal by using the second voltage division branch and performing voltage division according to $k_2$ to output a fourth voltage signal, wherein a difference between the third voltage signal and the fourth voltage signal is a first sampling signal.

13. The method according to claim 12, wherein the voltage sampling apparatus further comprises a calibration module, and the method further comprises:

obtaining, by using the calibration module, a second sampling signal through calculation based on the first deviation signal and the first sampling signal, wherein the second sampling signal indicates a difference between voltage signals obtained after voltage division is performed on the first differential output signal and the second differential output signal according to a same voltage division ratio, and the same voltage division ratio is the first voltage division ratio or the second voltage division ratio; and when the target signal is the first differential output signal, restoring, by using the calibration module according to $k_2$, the second sampling signal as a sampling value of a difference between the first differential output signal and the second differential output signal; or when the target signal is the second differential output signal, restoring, by using the calibration module according to $k_1$, the second sampling signal as a sampling value of a difference between the first differential output signal and the second differential output signal.

14. The method according to claim 13, wherein the obtaining, by using the calibration module, a second sampling signal through calculation based on the first deviation signal and the first sampling signal comprises:

calculating, by using the calibration module, the second sampling signal according to an equation $U_{sampling1}-U_{difference1}(k_1-k_2)=k_2(U_{difference1}-U_{difference2})$ or an equation $U_{sampling1}-U_{difference2}(k_1-k_2)=k_1(U_{difference1}-U_{difference2})$, wherein $U_{sampling1}$ indicates the first sampling signal, $U_{difference1}$ indicates the first differential output signal, $U_{difference2}$ indicates the second differential output signal, $U_{difference1}(k_1-k_2)$ and $U_{difference2}(k_1-k_2)$ indicate the first deviation signal, and $k_2(U_{difference1}-U_{difference2})$ and $k_1(U_{difference1}-U_{difference2})$ indicate the second differential sampling signal.

15. The method according to claim 12, wherein the differential circuit comprises a first switch group and a second switch group, wherein one end of an $i^{th}$ first switch in the first switch group is connected to a $(2i-1)^{th}$ cell in N series-connected cells, and the other end is connected to the first output end; one end of an $i^{th}$ second switch in the second switch group is connected to a $2i^{th}$ cell in the N series-connected cells, and the other end is connected to the second output end; and N is an integer greater than 1, and i=1, 2, . . . , or N.

16. The method according to claim 15, wherein the first calibration switch is in an on state, and the inputting, by using the differential circuit, a target signal to the first voltage division branch and the second voltage division branch that are connected in parallel comprises:

when the $i^{th}$ first switch is in an on state and the $i^{th}$ second switch is in an off state, receiving, by using the differential circuit, a first differential input signal output by the $(2i-1)^{th}$ cell, and inputting, by using the $i^{th}$ first switch that is switched on, the first differential output signal to the first voltage division branch and the second voltage division branch that are connected in parallel; or when the $i^{th}$ first switch is in an off state and the $i^{th}$ second switch is in an on state, receiving, by using the differential circuit, a second differential input signal output by the $2i^{th}$ cell, and inputting, by using the $i^{th}$ second switch that is switched on, the second differential output signal to the first voltage division branch and the second voltage division branch that are connected in parallel.

17. The method according to claim 15, wherein the first calibration switch is in an off state, and the inputting the first differential output signal to the first voltage division branch through the first output end of the differential circuit, and inputting the second differential output signal to the second voltage division branch through the second output end comprises:

when both the $i^{th}$ first switch and the $i^{th}$ second switch are in an on state, receiving, by using the differential circuit, a first differential input signal output by the $(2i-1)^{th}$ cell and inputting the first differential output signal to the first voltage division branch by using the $i^{th}$ first switch that is switched on, and receiving a second differential input signal output by the $2i^{th}$ cell and inputting the second differential output signal to the second voltage division branch by using the $i^{th}$ second switch that is switched on.

18. The method according to claim 15, wherein the voltage sampling apparatus further comprises a second calibration switch; one end of the second calibration switch is connected to the first end of the first calibration switch, and the other end is connected to a reference power supply; and when both the $i^{th}$ first switch and the $i^{th}$ second switch are in an off state, and the first calibration switch and the second calibration switch are in an on state, the method further comprises:

receiving, by using the second voltage division branch of the voltage division circuit, a reference voltage signal output by the reference power supply, and performing voltage division according to $k_2$ to output a fifth voltage signal, wherein the fifth voltage signal is used to calibrate $k_2$.

19. The method according to claim 18, wherein the restoring, according to $k_2$, the second sampling signal as a sampling value of a difference between the first differential output signal and the second differential output signal when the target signal is the first differential output signal comprises:

when the target signal is the first differential output signal, restoring, by using a calibration module according to the calibrated $k_2$, the second sampling signal as the sampling value of the difference between the first differential output signal and the second differential output signal.

20. The method according to claim 18, wherein when the $i^{th}$ first switch, the $i^{th}$ second switch, and the first calibration switch are all in an off state, and the second calibration switch is in an on state, the method further comprises:

receiving, by using the first voltage division branch of the voltage division circuit, the reference voltage signal output by the reference power supply, and performing voltage division according to $k_1$ to output a sixth voltage signal, wherein the sixth voltage signal is used to calibrate $k_1$.

* * * * *